United States Patent [19]

Joo et al.

[11] Patent Number: 5,450,421

[45] Date of Patent: Sep. 12, 1995

[54] METHOD FOR CORRECTING MULTIPLE ERRONEOUS SYMBOLS IN ERROR CORRECTING ENCODED DATA

[75] Inventors: Tae-shik Joo; Seok-jeong Lee, both of Seoul, Rep. of Korea

[73] Assignee: Samsung Electronics Co., Ltd., Suwon, Rep. of Korea

[21] Appl. No.: 133,230

[22] Filed: Oct. 7, 1993

[30] Foreign Application Priority Data

Oct. 7, 1992 [KR] Rep. of Korea .................... 18409

[51] Int. Cl.⁶ ............................................ G06F 11/101
[52] U.S. Cl. ............................... 371/37.5; 371/37.4
[58] Field of Search ................... 371/37.1, 37.4, 37.5, 371/34.1, 38.1, 40.1

[56] References Cited

U.S. PATENT DOCUMENTS

| | | | |
|---|---|---|---|
| 4,476,562 | 10/1984 | Sako et al. | 371/38.1 |
| 4,593,394 | 6/1986 | Tomimitsu | 371/38.1 |
| 4,646,301 | 2/1987 | Okamoto et al. | 371/38.1 |
| 4,675,869 | 6/1987 | Driessen | 371/39.1 |
| 4,852,099 | 7/1989 | Ozaki | 371/37.1 |
| 4,875,211 | 10/1989 | Murai et al. | 371/40.1 |
| 4,890,286 | 12/1989 | Hirose | 371/37.1 |

*Primary Examiner*—Paul P. Gordon
*Assistant Examiner*—Thomas E. Brown

*Attorney, Agent, or Firm*—Charles R. Donohoe; Robert A. Westerlund, Jr.; Stephen R. Whitt

[57] ABSTRACT

A method for correcting multiple erroneous symbols included in data produces a demodulation flag indicating whether demodulation based on a modulation code such as EFM or ETM is possible. The demodulation flag is used in decoding the data based on the error correcting code. Producing the error locations during decoding in accordance with a Reed-Solomon code comprises the steps of producing an index using $$\theta = \frac{k_2}{k_1^{3/2}}$$

provided $\sigma_1$, $\sigma_2$ and $\sigma_3$ represent coefficients of an error location polynomial, $k_1$ represents $\sigma_1^2 + \sigma_2$ and $k_2$ represents $\sigma_1\sigma_2 + \sigma_3$, reading out virtual roots from a specified memory related to the index, and transforming the virtual roots ($Z_1$, $Z_2$ and $Z_3$) into error locations ($x^{j1}$, $x^{j2}$ and $x^{j3}$) in accordance with the following equations.

$$x^{j1} = Z_1(k_1) + \sigma_1$$

$$x^{j2} = Z_2(k_1) + \sigma_1$$

$$x^{j3} = Z_3(k_1) + \sigma_1$$

26 Claims, 11 Drawing Sheets

FIG. 3

| | | | | | | | | | | | | | | |
|---|---|---|---|---|---|---|---|---|---|---|---|---|---|---|
| $D_{19,25}$ | $D_{19,24}$ | $D_{19,23}$ | | | $D_{19,0}$ | $Q_{19,5}$ | $Q_{19,4}$ | $Q_{19,3}$ | $Q_{19,2}$ | $Q_{19,1}$ | $Q_{19,0}$ | | | |
| $D_{18,25}$ | | | | | $D_{18,0}$ | | | | | | | | | |
| $D_{17,25}$ | | | | | $D_{17,0}$ | | | | | | | | | |
| — — — | | | | — — | | | | | | | — — — | | | |
| $D_{0,25}$ | $D_{3,30}$ | $D_{0,23}$ | | | $D_{0,0}$ | $Q_{0,5}$ | $Q_{0,4}$ | $Q_{0,3}$ | $Q_{0,2}$ | $Q_{0,1}$ | $Q_{0,0}$ | | | |
| $P_{3,31}$ | $P_{3,30}$ | | | | | $P_{3,5}$ | $P_{3,4}$ | $P_{3,3}$ | $P_{3,2}$ | $P_{3,1}$ | $P_{3,0}$ | | | |
| $P_{2,31}$ | $P_{2,30}$ | | | | | $P_{2,5}$ | | | | | $P_{2,0}$ | | | |
| $P_{1,31}$ | $P_{1,30}$ | | | | | $P_{1,5}$ | | | | | $P_{1,0}$ | | | |
| $P_{0,31}$ | $P_{0,30}$ | | | | | $P_{0,5}$ | | | | | $P_{0,0}$ | | | |

→ C2 Code Word

↓ C1 Code Word

METHOD FOR CORRECTING MULTIPLE ERRONEOUS SYMBOLS IN ERROR CORRECTING ENCODED DATA

FIELD OF THE INVENTION

The present invention relates to an error correcting method and, more particularly, to a multiple error correcting method for correcting erroneous symbols included in data that is encoded with an error correcting code and then modulated based on a modulation code such as eight-to-fourteen modulation (EFM), eight-to-ten modulation (ETM), etc.

BACKGROUND OF THE INVENTION

In conventional digital audio apparatus, such as a digital audio tape recorder (DAT) or compact disk (CD), audio data is encoded in accordance with the C1/C2 cross interleave product code. In more detail, audio data with a plurality symbols is first encoded in accordance with a second Reed-Solomon code (C2 code) capable of correcting triple errors, interleaved according to a predetermined order, and then encoded in accordance with a first Reed-Solomon code (C1 code) capable of correcting double errors.

In the conventional decoding system, a double-error correcting method or a quadruple-erasure correcting method is performed for decoding the data encoded based on the first Reed-Solomon code, a double-error correcting method or a sixfold-erasure correcting method are performed for decoding the data encoded based on the second Reed-Solomon code, under the constraint of real-time processing.

Here, an erasure is an erroneous symbol whose location is known. A symbol is a sequence of adjacent binary digits operated upon as a unit, and is the constitutional element of a word.

Conventional technologies related to this are disclosed in U.S. Pat. Nos. 4,476,562 assigned to Sony, and 4,875,211 assigned to Matsushita.

Referring to the Matsushita patent, the positions of two or more multiple-errors can be detected by a chain search algorithm. However, the calculation for the chain search algorithm must be repeatedly performed as many times as the number of symbols included in a word. On the other hand, in the Sony patent, a double-error correction and a quadruple-erasure correction can be easily performed, but a triple (or more) error correction cannot be performed.

SUMMARY OF THE INVENTION

An object of the present invention is to provide a multiple error correcting method for correcting multiple erroneous symbols.

Another object of the present invention is to provide a multiple error correcting method which can produce the error locations of three or more erroneous symbols and is easily performed in a Galois Field calculator in real time.

To achieve the object of the present invention, there is provided a multiple error correcting method for correcting erroneous symbols included in data encoded in accordance with an error correcting code and then modulated in accordance with a modulation code, comprising the steps of: demodulating the data in accordance with the modulation code and producing demodulated data with a demodulation flag indicating whether demodulation is possible; producing syndromes using a receiving word constituted by a plurality of the demodulated data based on the error correcting code; generating the number of erroneous symbols included in the receiving word based on the syndromes, and the number of erasures included in the receiving word based on the demodulation flags; determining the error form of the receiving word based on the number of erroneous symbols and the number of erasures; and correcting the receiving word based on the error correcting code and the error form.

To achieve the object of the present invention, there is also provided a multiple error correcting method for decoding data sequentially encoded in accordance with a first error correcting code and a second error correcting code and then modulated in accordance with a modulation code, comprising the steps of: demodulating the data based on the modulation code and producing demodulated data with a demodulation flag indicating whether demodulation is possible; producing first syndromes using a first receiving word constituted by a plurality of the demodulated symbol in accordance with the first error correcting code; determining the first error form of the first receiving word based on the first syndromes and demodulation flags therein; correcting the first receiving word based on the first error correcting code and the first error form, and then producing a decoded data including a plurality of error corrected symbols and error flags thereof indicating whether the error is corrected; producing second syndromes using a second receiving word including a plurality of the error corrected symbols in accordance with the second error correcting code; determining the second error form of the second receiving word based on the second syndromes and the error flags therein; and second-error-correcting by correcting the second receiving word based on the second error correcting code and the second error form.

To achieve the other object, the present invention provides a multiple error correcting method for correcting erroneous symbols included in data encoded based on an error correcting code, comprising the steps of: producing syndromes using the data; producing coefficients of an error location polynomial based on the syndromes, producing an index based on the coefficients, reading out a plurality of virtual roots of the error location polynomial from a specified memory related to the index, transforming the virtual roots into error locations based on a specified relationship, producing error values based on the syndromes and the error locations; and transforming the data into error-corrected data based on the error locations and the error values.

Also to achieve the other object of the present, one aspect of the multiple error correcting method comprises the steps of: producing an index $$\theta = \frac{k_2}{k_1^{3/2}}$$

wherein $\sigma_1$, $\sigma_2$ and $\sigma_3$ represent the error locations, $k_1$ represents $\sigma_1^2 + \sigma_2$ and $k_2$ represents $\sigma_1\sigma_2 + \sigma_3$, if the error correcting code is a Reed-Solomon code capable of correcting a triple erroneous symbols;

reading out virtual roots using the index from a specified memory which stores roots of the equation $f(Z) = Z^3 + Z + \theta$; and transforming the virtual roots into error locations as follows $$x^{j_1} = Z_1(k_1) + \sigma_1$$

$$x^{j_2} = Z_4(k_1) + \sigma_1$$

$$x^{j_3} = Z_3(k_1) + \sigma_1$$

wherein $Z_1$, $Z_2$ and $Z_3$ present the virtual roots, and $x^{j_1}$, $x^{j_2}$ and $x^{j_3}$ represent the error locations.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates a memory map of the C1/C2 cross interleave product code.

DETAILED DESCRIPTION OF THE INVENTION

Figure 1:
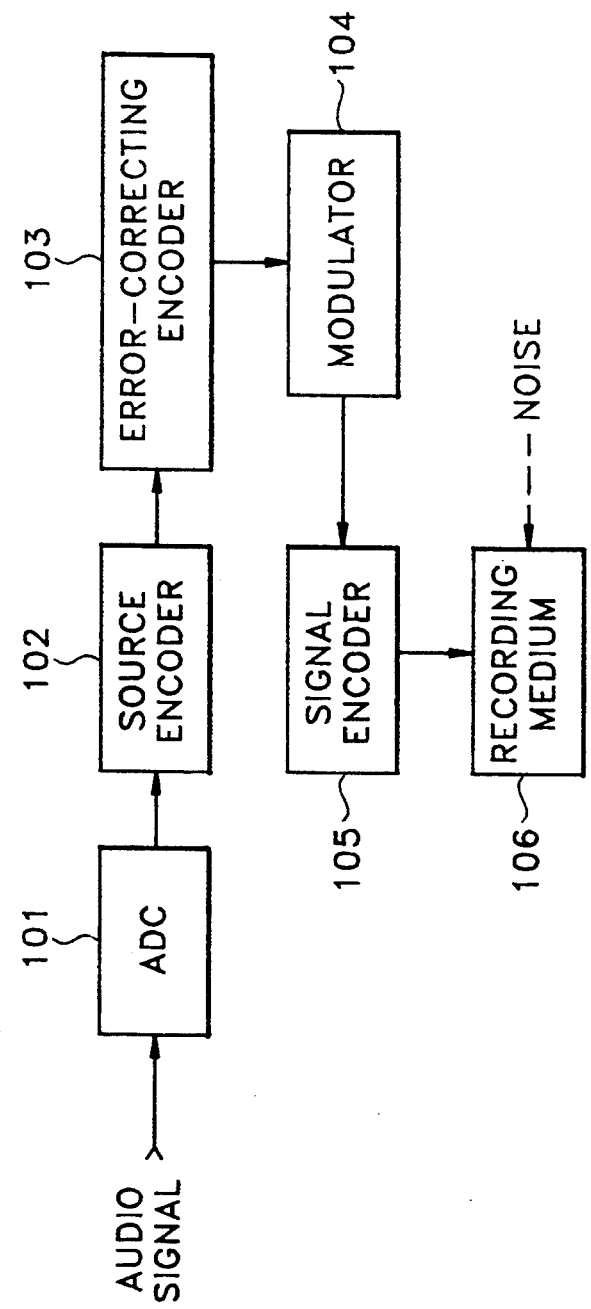
FIG. 1 is a schematic diagram of the digital audio recording system.

FIG. 1 is a schematic diagram of the digital audio recording system according to the present invention. The digital audio recording system includes an analog-to-digital converter 101, a source encoder 102, an error-correcting encoder 103, a modulator 104, a signal encoder 105 and a recording medium 106.

An audio signal is converted into digital data through analog-to-digital converter 101. This digital data is applied to source encoder 102, to be compressed in accordance with a specified algorithm. The compressed data is applied to error-correcting encoder 103, whereby it is encoded in accordance with an error code scheme such as C1/C2 cross interleave product code. Modulator 104 receives the output of error-correcting encoder 103 and then modulates the output based on a modulation code such as an EFM or ETM code.

Modulation code is also called run-length limited code, which constrains a run-length of 1 and/or 0 in binary sequence to a predetermined number. The EFM transforms 8-bit data into 14-bit data with run-length constraints, and the ETM transforms 8-bit data into 10-bit data with run-length constraints.

Binary information supplied from modulator 104 is recorded on recording medium 106 such as magnetic tape and magnetic disk in the form of a coded binary waveform. This coded binary waveform includes a non-return-to-zero (NRZ) coded waveform and a modified non-return-to-zero (NRZI) coded waveform. In the NRZ coding, a logic "1" and a logic "0" of the binary data can be identified by the positive-going and negative-going transitions of the waveform, respectively. In NRZI coding, a logic "1" and a logic "0" of the binary data may be represented by the presence and absence of transition in the binary waveform, respectively. Signal encoder 105 performs such signal encoding as NRZ coding or NRZI coding.

Figure 2:
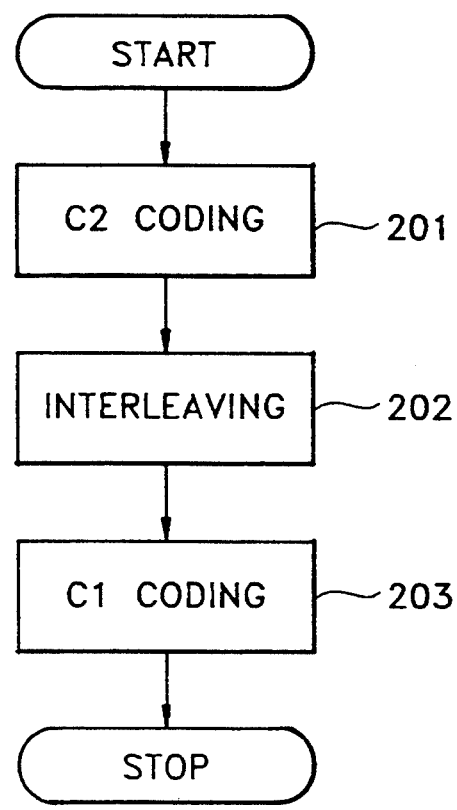
FIG. 2 is a flowchart which illustrates the operation of the error-correcting encoder shown in FIG. 1.

FIG. 2 is a flowchart which illustrates the operation of the error-correcting encoder shown in FIG. 1.

In step 201, C2 coding is performed, which is for encoding the data supplied from source encoder 102 in accordance with a second Reed-Solomon code capable of correcting double errors to produce C2 code words which include a plurality of symbols. The plurality of symbols included in the C2 code words are then interleaved in predetermined order in step 202. In step 203, C1 encoding is performed, which is for encoding the interleaved data in accordance with a first Reed-Solomon code capable of correcting triple errors.

FIG. 3 illustrates a memory map of the C1/C2 cross interleave product code, wherein the symbols arranged horizontally constitute a second code word concerning the C2 code and the symbols arranged vertically constitute a first code word concerning the C1 code. The C2 code is a Reed-Solomon code as denoted by RS(32,26,7) which is capable of correcting triple erroneous symbols and the C1 code is a Reed-Solomon code as denoted by RS(24,20,5) which is capable of correcting double erroneous symbols. As shown in FIG. 3, each C1 code word includes 24 symbols and each C2 code word includes 32 symbols. In more detail, each C1 code word includes 20 information symbols and four parity symbols (called P parity symbols), and each C2 code word includes 26 information symbols and six parity symbols (called Q parity symbols). Here, C2 coding generates the Q parity symbols which, together with the information symbols for the C2 code words, constitute the information symbols for a C1 code word. Meanwhile, the P parity symbols are generated in C1 coding.

Each symbol is comprised of 8-bits. In the memory map, $D_{\#,\#}$ denotes the symbols included in the data supplied from source encoder 102, $P_{\#,\#}$ denotes P parity symbols, and $Q_{\#,\#}$ denotes Q parity symbols.

Figure 4:
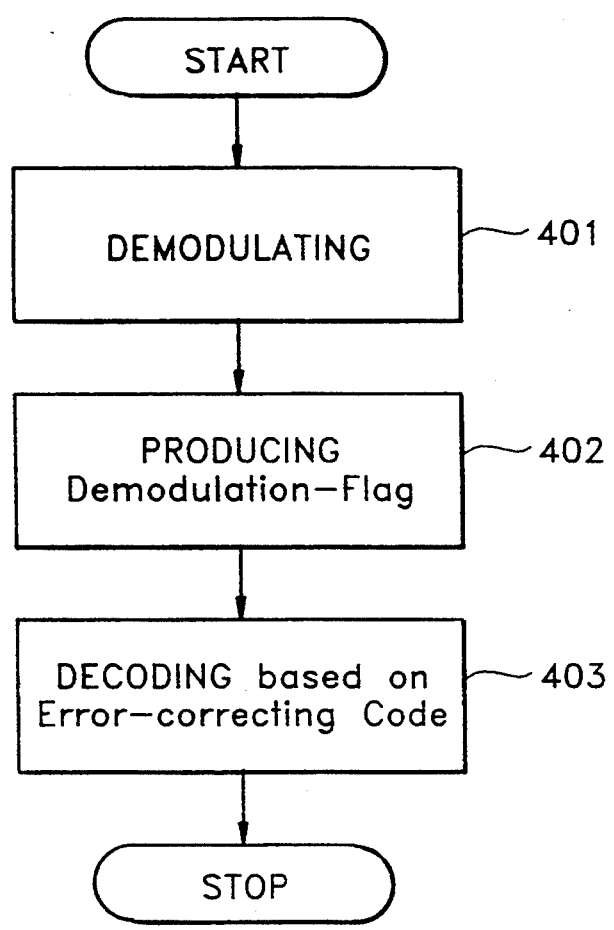
FIG. 4 is a flowchart illustrating the multiple error correcting method according to an embodiment of the present invention.

FIG. 4 is a flowchart illustrating the multiple error correcting method according to an embodiment of the present invention.

Referring to FIG. 4, in step 401, the data made by encoding based on an error correcting code and then modulating in accordance with a modulation code, is first demodulated based on the modulation code. For example, 14-bit data is demodulated into 8-bit data in accordance with EFM demodulation, while 10-bit data is demodulated into 8-bit data accordance with ETM demodulation. Here, if the 14-bit data (to be demodulated via EFM) or the 10-bit data (to be demodulated via ETM) includes an unallowable pattern, the demodulated 8-bit data (i.e., a demodulated symbol) can be set as a special bit pattern (e.g., "00000000" or "11111111"). In step 402, demodulation flags are produced, which signify whether or not the demodulation of each symbol is possible. Accordingly, after step 402, each symbol has one bit beyond the basic eight, which acts as a demodulation flag. The demodulation flag bit may be set to "1" in the case of demodulation being impossible and to "0" in the case of demodulation being possible. In step 403, the demodulated data is decoded using the demodulation flag of each symbol in accordance with the error correcting code. The demodulation flag plays an important role in producing the error location of an error location polynomial.

Figure 5:
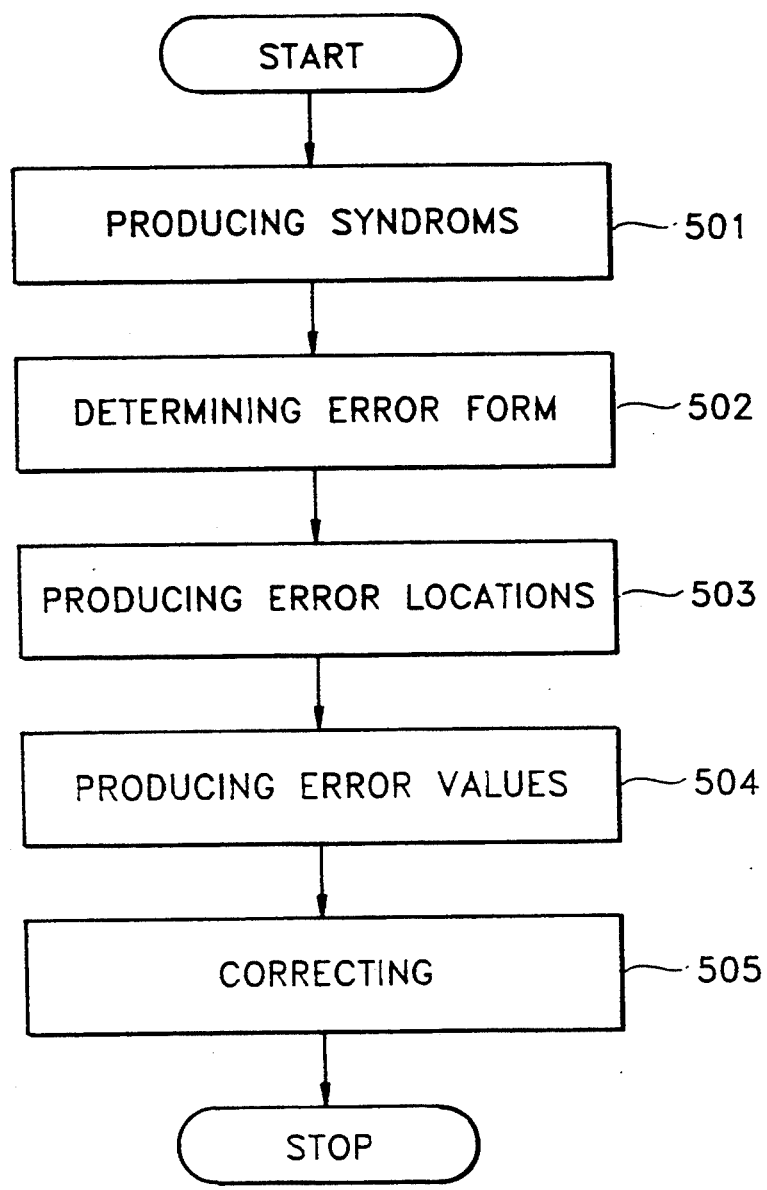
FIG. 5 is a flowchart illustrating step 403 shown in FIG. 4, under the constraint of the error correcting code being a Reed-Solomon code.

FIG. 5 is a flowchart for explaining step 403 shown in FIG. 4, under the constraint of the error correcting code being a Reed-Solomon code.

Referring to FIG. 5, syndromes are produced based on the error correcting code and the demodulated 8-bit data. In more detail, syndromes ($S_k$) are produced in accordance with the formula $$S_k = r(\alpha^{k+1})$$

wherein k is a whole number, $\alpha$ is a primitive polynomial of the Reed-Solomon code in Galois Field GF($2^8$), and r(x) represents a receiving polynomial made of a plurality of demodulated symbols. For example, the receiving polynomial is 24 symbols if the Reed-Solomon code is a RS(24,20,5), and the receiving polynomial is 32 symbols if the Reed-Solomon code is a RS(32,26,7). The number of syndromes is 4t or more, provided that the Reed-Solomon code is for correcting t errors, because the total number of erroneous symbols is 2t. Here, the erroneous symbols includes errors and erasures.

In step 502, the error form of the receiving polynomial is determined based on the numbers of syndromes and erasures, erasure being representative of symbols having a demodulation flag of "1." Step 503 is for producing error locations of the error location polynomial, using the demodulation flag. Error locations represent the location of the erroneous symbols in the receiving polynomial. Accordingly, if the nth symbol in the receiving polynomial has the demodulation flag set to "1," the error location is "n." Step 504 is for producing error values using the error locations based on the Reed-Solomon code, and step 505 is for correcting the receiving polynomial in accordance with the error locations and the error values. That is, by letting the error values be $e_1 e_2 \ldots, e_v$, and the error presumption polynomial $\Omega(x)$ be
$\sigma_v + (\sigma_v S_0 + \sigma_{v1})x + (\sigma_v S_1 + \sigma_{v1} S_0 + \sigma_{v2})x^2 + \ldots + (\sigma_v S_{v1} + \sigma_{v1} S_{v2} + \ldots + 1)x^v$, the error values are produced in accordance with the following:

$$e_j = \frac{\Omega(\alpha^{-j})}{\prod_{\substack{i=1 \\ i \neq j}}^{v}(1 + \alpha^{-i}\alpha^{-j})} \quad \text{Eq. (1)}$$

Then, the correcting of the receiving polynomial is performed based on the following:

$$c(x) = r(x) + e(x)$$

wherein e(x) satisfies the equation $$e(x) = e_1 x^{j_1} + e_2 x^{j_2} + \ldots + e_v x^{j_v}$$

c(x) represents the corrected polynomial or the corrected word, and r(x) represents the receiving polynomial or the receiving word.

Figure 6:
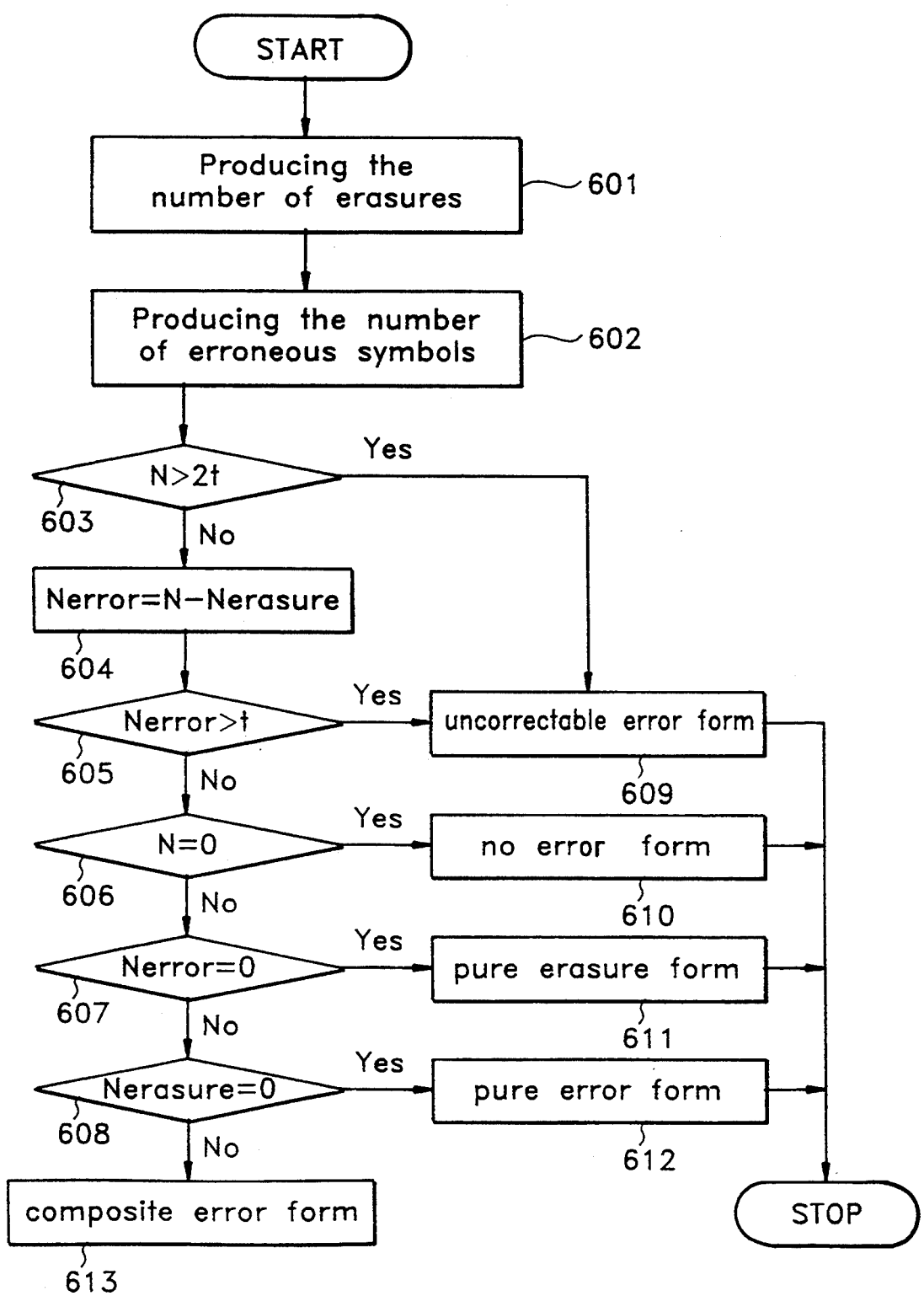
FIG. 6 is a flowchart illustrating the step 502 shown in FIG. 5.

FIG. 6 is for explaining the step 502 shown in FIG. 5.

Referring to FIG. 6, step 601 is for producing the number of erasures by counting the number of symbols having their corresponding demodulation flags set to "1" in a receiving polynomial. In step 602, the number of erroneous symbols included in the receiving polynomial is produced in accordance with the syndromes.

To determine the number of erroneous symbols, a matrix M is used, and is expressed $$M = \begin{bmatrix} S_{v-1} & S_{v-2} & \ldots & S_1 & S_0 \\ S_v & S_{v-1} & \ldots & S_2 & S_1 \\ \cdot & \cdot & & \cdot & \cdot \\ \cdot & \cdot & & \cdot & \cdot \\ \cdot & \cdot & & \cdot & \cdot \\ S_{2v-2} & S_{2v-3} & \ldots & S_v & S_{v-1} \end{bmatrix}$$

where v is a variable of 2t+1, 2t, 2t 1 . . . , 1.

Among values of the variable v, the maximum value which causes the determinant value of matrix M not to equal "0" (i.e., det[M]≠0), is the number of erroneous symbols in the receiving polynomial. Here, if the maximum value or the number of erroneous symbols is 2t+1, error correction is not possible.

Step 603 is for determining whether or not the number of erroneous symbols N is more than 2t, provided that the Reed-Solomon code is capable of correcting t multiple errors. If the number of erroneous symbols N is more than 2t, the error form is determined to be an "uncorrectable" error form in step 609. In step 604, the number of pure errors $N_{error}$ is produced by subtracting the number of erasures ($N_{erasure}$) from the number of erroneous symbols N. Here, the pure error is an erroneous symbol whose location is not known. Step 605 is for determining whether or not the number of pure errors ($N_{error}$) is more than t, provided that the Reed-Solomon code is capable of correcting t multiple errors. If the number of pure errors $N_{error}$ is greater than t, the error form is determined to be the uncorrectable error form in step 609. Step 606 is for determining whether or not the number of erroneous symbols N is zero. If the number of erroneous symbols is zero, the error form is determined to be a "no error" form in step 610. In step 607, it is determined whether or not the number of pure errors $N_{error}$ is zero, and if so, the error form is determined to be a pure erasure form in step 611. In step 608, it is determined whether the number of erasures $N_{erasure}$ is zero. If the number of erasures $N_{erasure}$ is zero, the error form is determined to be a "pure error" form in step 612, if not, the error form is determined to be a "composite" error form in step 613. The composite error form is for the receiving polynomial including at least one pure error and at least one erasure.

Figure 7:
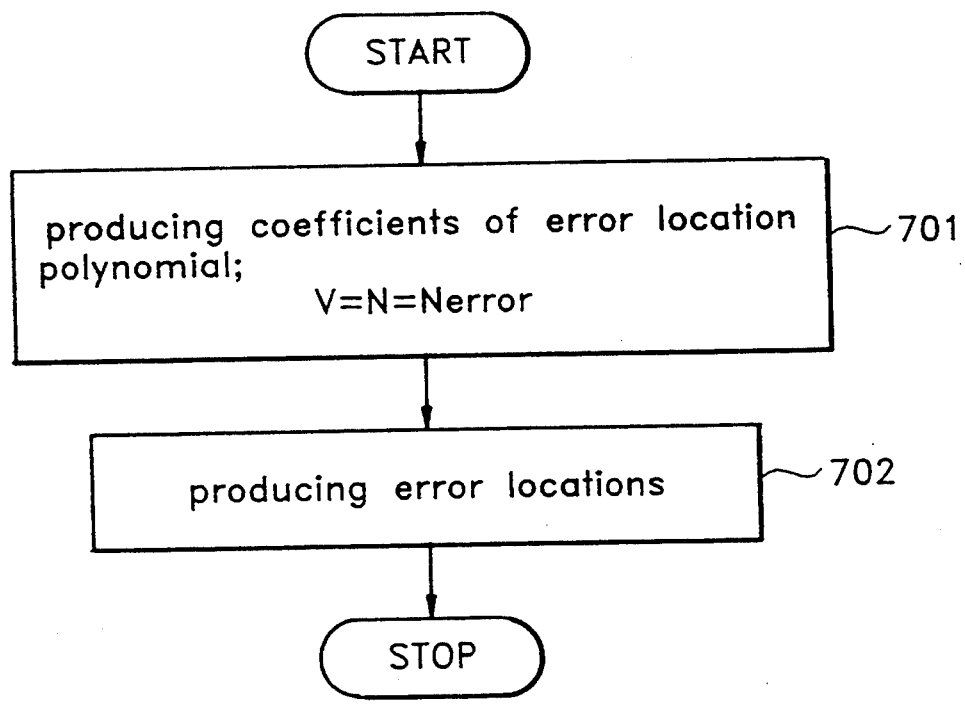
FIG. 7 is a flowchart illustrating the step 503 shown in FIG. 5, provided that the error form is pure error form in which the receiving polynomial includes only erroneous symbols whose locations are not known.

FIG. 7 is for explaining the step 503 shown in FIG. 5, provided that the error form is pure error form in which the receiving polynomial includes only erroneous symbols whose locations are not known.

Referring to FIG. 7, step 701 is for producing the coefficients of a vth-order error location polynomial $\sigma(x)$. Here, the order value v is equal to the number of erroneous symbols and, in more detail, equals the number of pure errors. The error location polynomial of the vth order can be represented $$\sigma(x) = x^v + \sigma_1 x^{v-1} + \ldots + \sigma_{v-1} x + \sigma_v$$

where $\sigma_1$ through $\sigma_v$ are coefficients.

The coefficients of error location polynomial are produced as follows:

$$\begin{bmatrix} \sigma_1 \\ \sigma_2 \\ \cdot \\ \cdot \\ \cdot \\ \sigma_v \end{bmatrix} = \begin{bmatrix} S_{v-1} & S_{v-2} & \ldots & S_1 & S_0 \\ S_v & S_{v-1} & \ldots & S_2 & S_1 \\ \cdot & & & & \cdot \\ \cdot & & & & \cdot \\ \cdot & & & & \cdot \\ S_{2v-2} & S_{2v-3} & \ldots & S_v & S_{v-1} \end{bmatrix}^{-1} \begin{bmatrix} S_v \\ S_{v+1} \\ \cdot \\ \cdot \\ \cdot \\ S_{2v-1} \end{bmatrix} \quad \text{Eq. (2)}$$

For example, if v is two (2nd order), the error location polynomial can be represented by $\sigma(x) = x^2 + \sigma_1 x + \sigma_2$. The coefficients $\sigma_1$ and $\sigma_2$ of this error location polynomial are produced by using the following equations.

$$\begin{bmatrix} S_2 \\ S_3 \end{bmatrix} = \begin{bmatrix} S_1 & S_0 \\ S_2 & S_1 \end{bmatrix} \cdot \begin{bmatrix} \sigma_1 \\ \sigma_2 \end{bmatrix}$$

$$\sigma_1 = \frac{S_3 S_0 + S_1 S_2}{S_1^2 + S_2 S_0}$$

$$\sigma_2 = \frac{S_2^2 + S_1 S_3}{S_1^2 + S_2 S_0}$$

Step 702 is for producing the error locations which are the roots of the error location polynomial of vth order. With regard to obtaining the roots of an equation such as error location polynomial, the higher the order of the equation is, the more difficult producing the roots thereof is. Ordinarily, fifth-order equations and higher are, in many cases, unsolvable.

However, in the Galois Field for Reed-Solomon code, the roots can be theoretically obtained, because the roots are the elements included in the Galois Field which includes a finite number of elements. That is, the roots are produced by substituting all elements included in the Galois Field for x in the error location polynomial and then seeking the element which satisfies the equation.

However, the roots of an equation have to be obtained in more efficient manner, when under the constraints of real-time processing and considering hardware realization. The algorithms related thereto are disclosed in the embodiments of the prior art, but are insufficient for triple error correction and higher.

The present invention aims to provide a method for efficiently producing the error locations of the error location polynomial, particularly for triple-error-corrections. This method will be explained in reference with FIG. 11.

Figure 8:
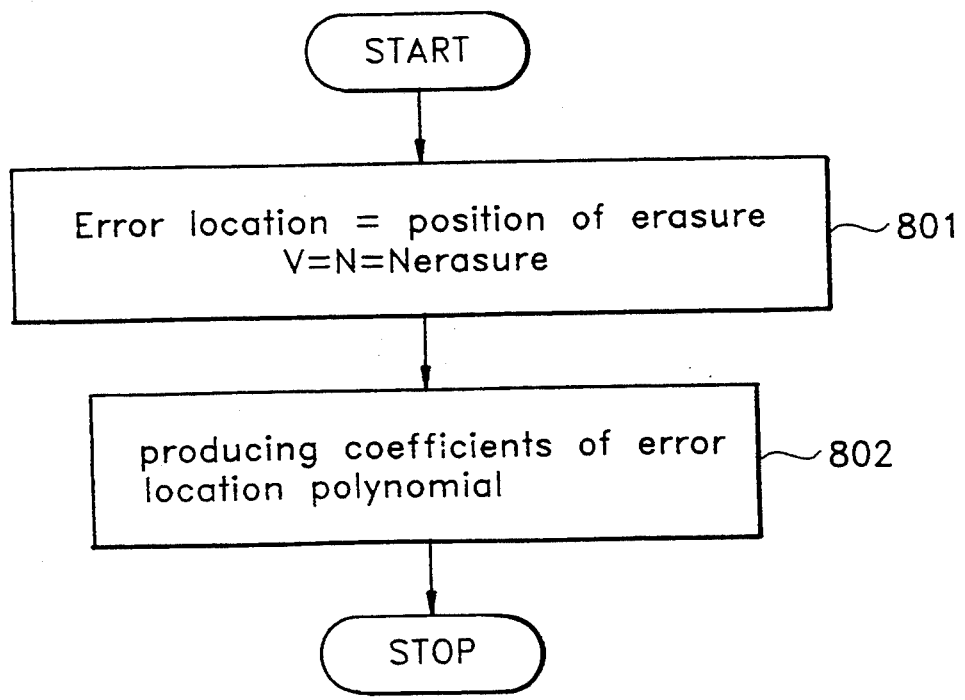
FIG. 8 is a flowchart illustrating step 503 shown in FIG. 5, provided that the error form is that for a pure erasure in which the receiving polynomial includes only erroneous symbols whose locations are known.

FIG. 8 is for explaining step 503 shown in FIG. 5, provided that the error form is that for a pure erasure in which the receiving polynomial includes only erroneous symbols whose locations are known.

Referring to FIG. 8, in step 801, the error locations are produced by the position of erasures being substituted for the error locations $x^{j_1}, x^{j_2}, \ldots, x^{j_v}$, where "v" is the number of erroneous symbols or erasures.

Step 802 is for producing the coefficients of the error location polynomial $\sigma(x)$, that is, $\sigma_v + \sigma_{v-1} x + \sigma_{v-2} x^2 + \ldots + x^v$. Here, "x" of the error location polynomial is substituted by the error locations $x^{j_1}$-$x^{j_v}$, thereby v simultaneous equations are composed. The solutions of v simultaneous equations are coefficients of the error location polynomial. Accordingly, coefficients are produced in accordance with the error locations.

Figure 9:
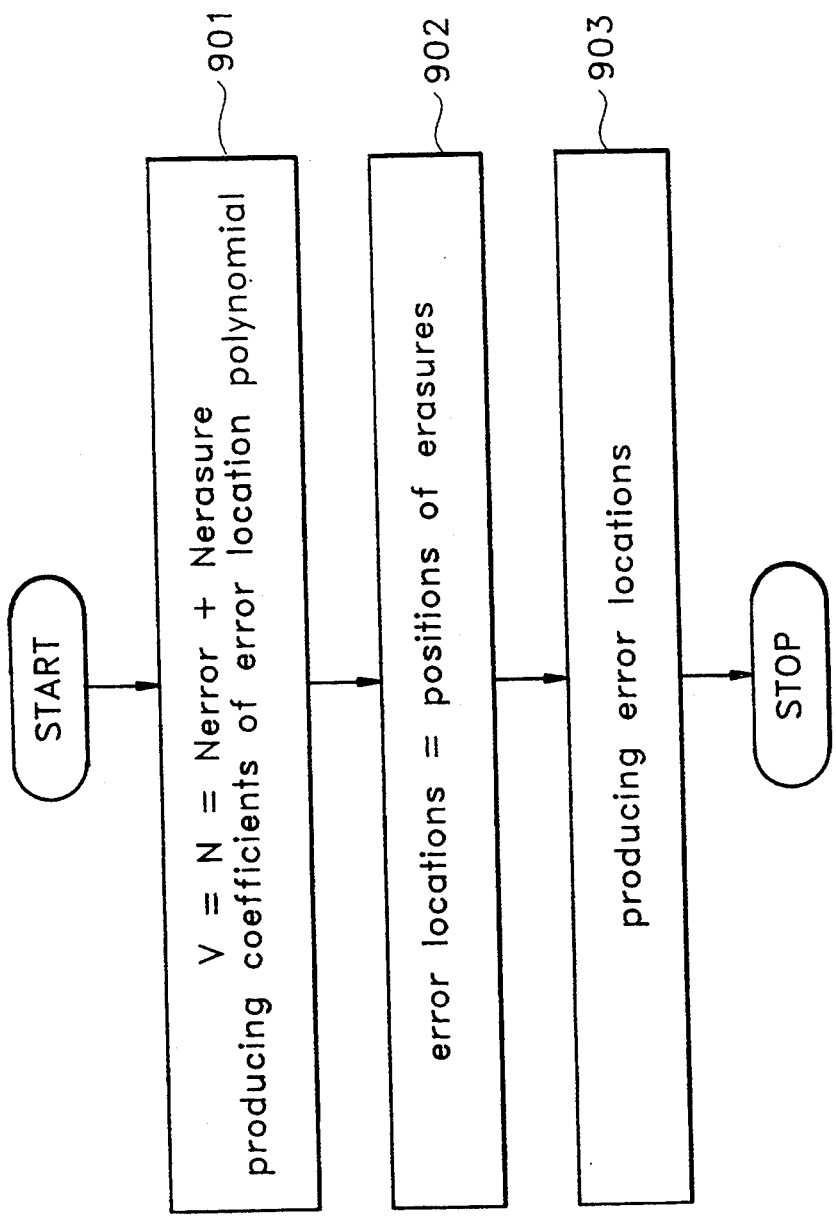
FIG. 9 is a flowchart illustrating step 503 shown in FIG. 5, provided that the error form is that for a composite error in which the receiving polynomial includes both pure errors and erasures.

FIG. 9 is for explaining step 503 shown in FIG. 5, provided that the error form is that for a composite error in which the receiving polynomial includes both pure errors and erasures.

Referring to FIG. 9, Step 901 is for producing coefficients of error location polynomial $\sigma(x)$, that is, $x^v + \sigma_1 x^{v-1} + \ldots \sigma_{v-1} x + \sigma_v$, where "v" is the number of erroneous symbols or the sum of $N_{error}$ and $N_{erasure}$. The coefficients $\sigma_1$ through $\sigma_v$ are produced in accordance with the above Equation 2.

In step 902, $N_{erasure}$ error locations are substituted by the positions of erasures in the receiving polynomial. Step 903 is for producing $N_{error}$ locations in accordance with the relationship of the error locations and the coefficients, or the relationship of the roots and the coefficients of an equation. A more detailed description related to step 903 is referenced in U.S. Pat. No. 4,476,562 by Sony.

Figure 10:
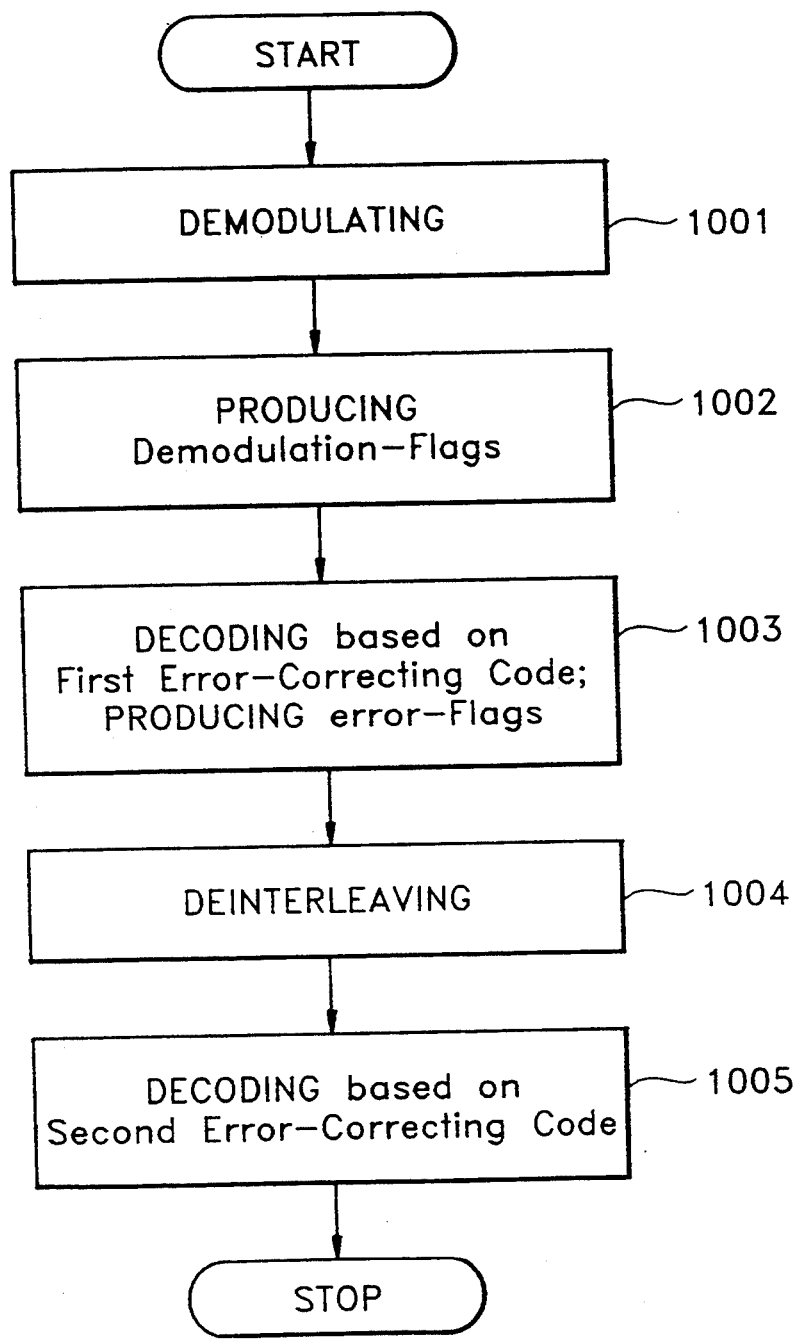
FIG. 10 is a flowchart illustrating the multiple error correcting method according to another embodiment of the present invention.

FIG. 10 is a flowchart for illustrating the multiple error correcting method according to another embodiment of the present invention.

Referring to FIG. 10, in step 1001, the data made by sequentially encoding based on a second error correcting code and a first error correcting code and then modulating in accordance with a modulation code, is first demodulated based on the modulation code. (This step is the same as step 401 of FIG. 4.)

In step 1002, the demodulation flags are produced, which signifies whether or not the demodulation of each symbol is possible. Step 1003 is for decoding a first receiving polynomial based on the first error correcting code such as Reed-Solomon code RS(24,20,5) which is capable of correcting double errors. Here, the first receiving polynomial includes a plurality of demodulated symbols (e.g., 24 symbols), provided that the first Reed-Solomon code is RS(24,20,5). Also, step 1003 is for producing error flags indicating whether or not each symbol has been corrected. (Decoding the first receiving polynomial in step 1003 can be explained by FIG. 5 through FIG. 9.)

In step 1004, the decoded symbols are deinterleaved in accordance with a predetermined order which is the inverse of the interleaving order. Step 1005 is for decoding a second receiving polynomial based on the second error correcting code such as Reed-Solomon code RS(32,26,7) which is capable of correcting triple errors. The second receiving polynomial is composed of a plurality of decoded symbols (e.g., 32 symbols) of step 1003, provided that the second error correcting code is RS(32,26,7). (Step 1005 can be also explained by FIGS. 5-9.)

Figure 11:
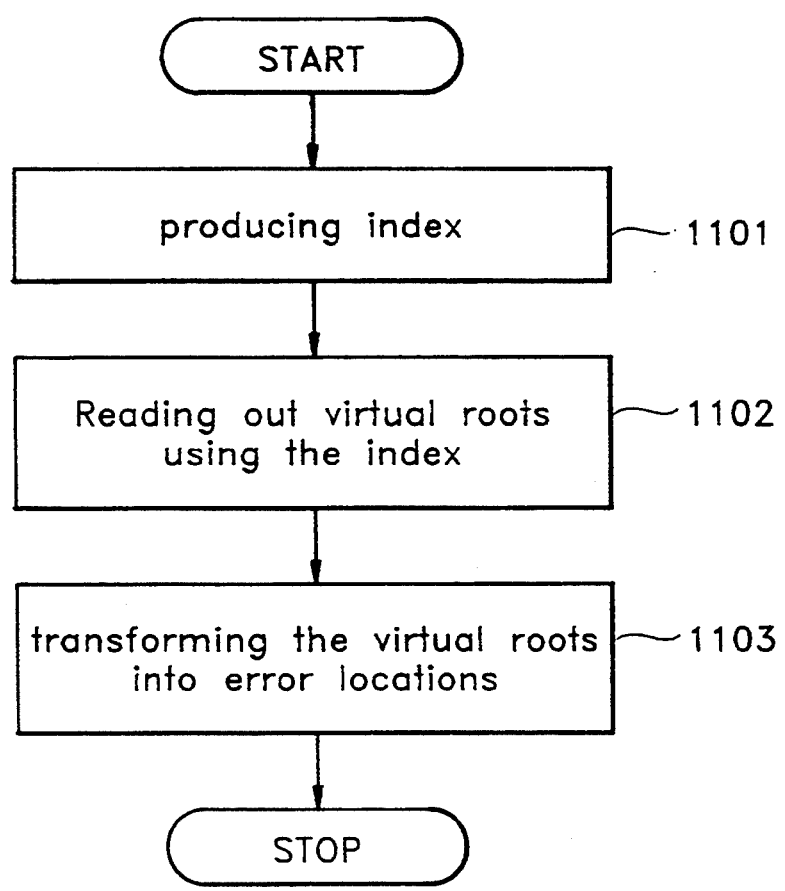
FIG. 11 is a flowchart illustrating the method of producing error locations according to an embodiment of the present invention.

FIG. 11 is for explaining the method of producing error locations according to an embodiment of the present invention.

Referring to FIG. 11, step 1101 is for producing an index $\theta$ using coefficients of the error location polynomial. In step 1102, virtual roots are read out from a specified memory related to the index $\theta$. The specified memory is also called a look-up table (LUT) which includes a plurality of roots with regard to a predetermined equation such as $Z^3+Z+\theta=0$. Step 1103 is for transforming the virtual roots into error locations in accordance with a predetermined relationship.

Hereinafter, characteristics of a higher-order equation and the solutions thereof will described.

The general forms of third-order (or higher) equations are expressed as follows:

3rd order:
$$f(x)=x^3+cx^2+bx+a$$

4th order:
$$f(x)=x^4+dx^3+cx^2+bx+a$$

5th order:
$$f(x)=x^5+ex^4+dx^3+cx^2+bx+a$$

and so on.

In the above equations, once the coefficients are determined, the roots thereof can be obtained because the roots are the elements of a finite field such as $GF(2^8)$. That is, all elements included in the finite field are sequentially substituted for the x value, and thus the element satisfying the equation is detected. This method, however, requires too much time, so as to make impractical.

Another method for producing the roots is performed by a large LUT which stores the roots themselves. The roots included in the large LUT are calculated in a preprocessing state, and addresses of the large LUT have a one-to-one correspondence with the coefficients of the equation. Accordingly, the large LUT uses up too much memory, thereby rendering it also impractical.

Here, let us consider the third order equation. The above third order equation can be rewritten as $f(Z)=Z^3+Z+\theta=0$.

First, substituting the term $mZ+n$ for the variable x in the equation $x^3+cx^2+bx+a=0$, gives us the equation $$(mZ+n)^3+c(Z+m)^2+b(mZ+n)+a=0$$

which develops into $$(m^3Z^3+3m^2Z^2n+3mZn^2+n^3)+c(m^2Z^2+2mZn+n^2)+b(mZ+n)+a=0$$

By grouping similar terms of the above equation, the resulting equation can be expressed $$Z^3(m^3)+Z^2(3m^2n+cm^2)+Z(3mn^2+2cmn+bm)+(n^3+cn^2+bn+a)=0$$

Then, dividing the equation by $m^3$, in order to make the coefficient of the highest term ($Z^3$) equal unity, results in the equation $$Z^3 + Z^2\left(\frac{3m^2n + cm^2}{m^3}\right) +$$

$$Z\left(\frac{3mn^2 + 2cmn + bm}{m^3}\right) + \left(\frac{n^3 + cn^2 + bn + a}{m^3}\right) = 0$$

Here, comparing the coefficients of the equation with those of equation $Z^3+Z+\theta=0$ shows that $3m^2n+cm^2=0$ and $3mn^2+2cmn+bm=m^3$.

At this moment, the above step of calculating the solution of the aforementioned polynomial is executed on the finite field, that is GF(q), so that the above equations can be equivalently transformed into $$m^2n+cm^2=m^2(n+c)=0$$

and $$mn^2+bm=m^3$$

Therefore, in terms of a, b and c, the above variable m is equal to $(c^2+b)$ and the above variable n is equal to c. Likewise, $\theta$ can be expressed as follows:

$$\theta = \frac{n^3 + cn^2 + bn + a}{m^3}$$
$$= \frac{bc + a}{(c^2 + b)^{3/2}}$$

The roots $Z_1$, $Z_2$ and $Z_3$ satisfying the equation $f(Z)=Z^3+Z+\theta=0$, according to possible values of $\theta$, are obtained by the preprocessing step, to be stored in the ROM table (or LUT). Thereafter, only the address or index $\theta$ are designated by the processing step.

Figure 12:
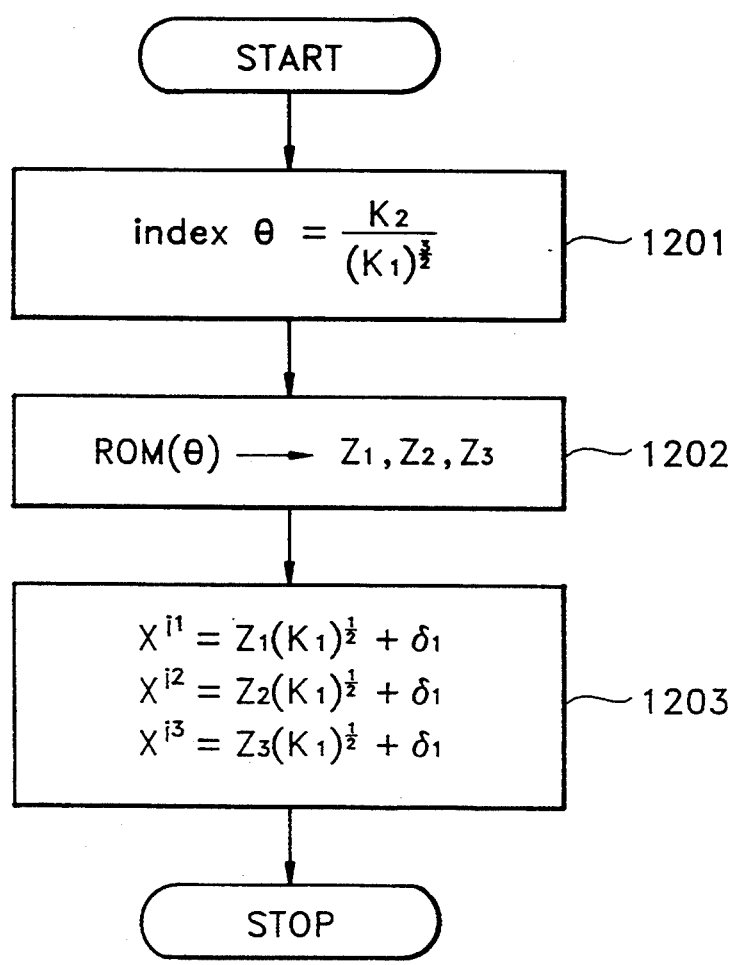
FIG. 12 is a flowchart illustrating the method of producing error locations of a third-order location polynomial.

FIG. 12 is for explaining the method of producing error locations of a third-order error location polynomial.

Referring to FIG. 12, step 1201 is for producing an index $\theta$ in accordance with the following:

$$\theta = \frac{k_2}{k_1^{3/2}} \qquad \text{Eq. (3)}$$

wherein $k_1=(\sigma_1^2+\sigma_2)^{3/2}$, $k_2=\sigma_1\sigma_2+\sigma_3$, and $\sigma_1$, $\sigma_2$ and $\sigma_3$ represent coefficients of the error location polynomial with 3 order.

Step 1202 is for reading out virtual roots $Z_1$, $Z_2$ and $Z_3$ from the specified memory which stores the roots of the equation $f(Z)=Z_3+Z+\theta=0$.

In step 1203, virtual roots $Z_1$, $Z_2$ and $Z_3$ are transformed into error locations $X^{j_1}$, $X^{j_2}$ and $X^{j_3}$ in accordance with the following:

$$x^{j_1}=Z_1(k_1)^{\frac{1}{2}}+\sigma_1$$

$$x^{j_2}=Z_2(k_1)^{\frac{1}{2}}+\sigma_1$$

$$x^{j_3}=Z_3(k_1)^{\frac{1}{2}}+\sigma_1 \qquad \text{Eq.(4)}$$

The triple error correcting method above described will be explained with reference to a detailed example.

Assume that the code word $c(x)=0$ from encoding by means of RS(36,26,7) is recorded onto, and then reproduced from, a predetermined recording medium. Thus, the receiving polynomial becomes $$r(x) = \alpha^3 X^5 + \alpha^{15} x^{12} + \alpha^{21} x^{17}$$

Here, since the error polynomial e(x) becomes c(x)+r(x), then $$e(x) = \alpha^3 x^5 + \alpha^{15} x^{12} + \alpha^{21} x^{17}$$

wherein $\alpha^3$, $\alpha^{15}$ and $\alpha^{21}$ conform to the error values $e_1$, $e_2$ and $e_3$, respectively, and $x^5$, $x^{12}$ and $x^{17}$ conform to the error locations $x^{j1}$, $x^{j2}$ and $x^{j3}$, respectively. In an RS decoder which receives the receiving polynomial, six syndromes $S_0$–$S_5$ are produced based on the receiving polynomial. These are:

$$S_0 = r(\alpha^0) = \alpha^{92}$$

$$S_1 = r(\alpha^1) = \alpha^{128}$$

$$S_2 = r(\alpha^2) = \alpha^{224}$$

$$S_3 = r(\alpha^3) = \alpha^{139}$$

$$S_4 = r(\alpha^4) = \alpha^{74}$$

$$S_5 = r(\alpha^5) = \alpha^{47}$$

Then, three coefficients $\sigma_1$, $\sigma_2$ and $\sigma_3$ are produced in accordance with the above syndromes, with the following results.

$$\sigma_1 = \alpha^{21}$$

$$\sigma_2 = \alpha^{139}$$

$$\sigma_3 = \alpha^{34}$$

After obtaining the coefficients of the error location polynomial, an index $\theta$ is produced for accessing the specified memory (ROM table or LUT) according to the following:

$$\theta = \frac{k_2}{k_1^{3/2}}$$

$$= \frac{\sigma_1 \sigma_2 + \sigma_3}{(\sigma_1^2 + \sigma_2)^{3/2}}$$

$$= \alpha^{51}$$

and $$k_1 = \sigma_1^2 + \sigma_2$$

$$= \alpha^{232}$$

$$k_2 = \sigma_1 \sigma_2 + \sigma_3$$

$$= \alpha^{144}$$

The virtual roots are read out from a specified memory with reference to index $\theta$ ($\alpha^{51}$). The virtual roots are $$Z_1 = \alpha^1$$

$$Z_2 = \alpha^{16}$$

$$Z_3 = \alpha^{34}$$

These virtual roots are transformed into error locations, with following results.

$$x^{j1} = \alpha^1 (\alpha^{232})^{\frac{1}{3}} + \alpha^{21}$$

$$= \alpha^{17}$$

$$x^{j2} = \alpha^{16} (\alpha^{232})^{\frac{1}{3}} + \alpha^{21}$$

$$= \alpha^{12}$$

$$x^{j3} = \alpha^{34} (\alpha^{232})^{\frac{1}{3}} + \alpha^{21}$$

$$= \alpha^5$$

Then, the error values are produced in accordance with the thus produced error locations, whereby the error polynomial is composed and the receiving polynomial is corrected.

Table 1 shows the ROM table used in the triple error correcting, where the index $\theta$ corresponds to an address of the ROM and $Z_1$, $Z_2$ and $Z_3$ are the roots of the equation $f(Z) = Z^3 + Z + \theta$ stored in the ROM. Moreover, in each element, the superscripted alpha value ($\alpha^{\#\#\#}$) on the left is an exponential presentation thereof, and the hexadecimal data on the right is a binary presentation thereof.

TABLE I

| index | root1 | root2 | root3 |
|---|---|---|---|
| $\alpha^{000} = 01$ | | | |
| $\alpha^{001} = 02$ | | | |
| $\alpha^{002} = 04$ | | | |
| $\alpha^{003} = 08$ | $\alpha^{125} = 33$ | | |
| $\alpha^{004} = 10$ | | | |
| $\alpha^{005} = 20$ | $\alpha^{184} = 95$ | | |
| $\alpha^{006} = 40$ | $\alpha^{250} = 6c$ | | |
| $\alpha^{007} = 80$ | | | |
| $\alpha^{008} = 1d$ | | | |
| $\alpha^{009} = 3a$ | | | |
| $\alpha^{010} = 74$ | $\alpha^{113} = 1f$ | | |
| $\alpha^{011} = e8$ | $\alpha^{012} = cd$ | | |
| $\alpha^{012} = cd$ | $\alpha^{245} = e9$ | | |
| $\alpha^{013} = 87$ | $\alpha^{130} = 2e$ | | |
| $\alpha^{014} = 13$ | | | |
| $\alpha^{015} = 26$ | $\alpha^{149} = a4$ | | |
| $\alpha^{016} = 4c$ | | | |
| $\alpha^{017} = 98$ | $\alpha^{051} = 0a$ | $\alpha^{058} = 69$ | $\alpha^{163} = 63$ |
| $\alpha^{018} = 2d$ | | | |
| $\alpha^{019} = 5a$ | | | |
| $\alpha^{020} = b4$ | $\alpha^{226} = 48$ | | |
| $\alpha^{021} = 75$ | $\alpha^{240} = 2c$ | | |
| $\alpha^{022} = ea$ | $\alpha^{024} = 8f$ | | |
| $\alpha^{023} = c9$ | $\alpha^{077} = 3c$ | | |
| $\alpha^{024} = 8f$ | $\alpha^{235} = eb$ | | |
| $\alpha^{025} = 03$ | $\alpha^{074} = 89$ | | |
| $\alpha^{026} = 06$ | $\alpha^{005} = 20$ | | |
| $\alpha^{027} = 0c$ | $\alpha^{025} = 03$ | | |
| $\alpha^{028} = 18$ | | | |
| $\alpha^{029} = 30$ | | | |
| $\alpha^{030} = 60$ | $\alpha^{043} = 77$ | | |
| $\alpha^{031} = c0$ | | | |
| $\alpha^{032} = 9d$ | | | |
| $\alpha^{033} = 27$ | | | |
| $\alpha^{034} = 4e$ | $\alpha^{071} = bc$ | $\alpha^{102} = 44$ | $\alpha^{116} = f8$ |
| $\alpha^{035} = 9c$ | $\alpha^{073} = ca$ | | |
| $\alpha^{036} = 25$ | | | |
| $\alpha^{037} = 4a$ | $\alpha^{162} = bf$ | | |
| $\alpha^{038} = 94$ | | | |
| $\alpha^{039} = 35$ | | | |
| $\alpha^{040} = 6a$ | $\alpha^{197} = 8d$ | | |
| $\alpha^{041} = d4$ | $\alpha^{021} = 75$ | | |
| $\alpha^{042} = b5$ | $\alpha^{225} = 24$ | | |
| $\alpha^{043} = 77$ | $\alpha^{211} = b2$ | | |
| $\alpha^{044} = ee$ | $\alpha^{048} = 46$ | | |
| $\alpha^{045} = c1$ | | | |
| $\alpha^{046} = 9f$ | $\alpha^{154} = 39$ | | |
| $\alpha^{047} = 23$ | $\alpha^{076} = 1e$ | $\alpha^{227} = 90$ | $\alpha^{254} = 8e$ |
| $\alpha^{048} = 46$ | $\alpha^{215} = ef$ | | |
| $\alpha^{049} = 8c$ | | | |
| $\alpha^{050} = 05$ | $\alpha^{148} = 52$ | | |

TABLE I-continued

| index | root1 | root2 | root3 |
|---|---|---|---|
| $\alpha^{051} = 0a$ | $\alpha^{001} = 02$ | $\alpha^{016} = 4c$ | $\alpha^{034} = 4e$ |
| $\alpha^{052} = 14$ | $\alpha^{010} = 74$ | | |
| $\alpha^{053} = 28$ | $\alpha^{186} = 6e$ | | |
| $\alpha^{054} = 50$ | $\alpha^{050} = 05$ | | |
| $\alpha^{055} = a0$ | | | |
| $\alpha^{056} = 5d$ | | | |
| $\alpha^{057} = ba$ | | | |
| $\alpha^{058} = 69$ | | | |
| $\alpha^{059} = d2$ | | | |
| $\alpha^{060} = b9$ | $\alpha^{086} = b1$ | | |
| $\alpha^{061} = 6f$ | $\alpha^{208} = 51$ | | |
| $\alpha^{062} = de$ | | | |
| $\alpha^{063} = a1$ | $\alpha^{033} = 27$ | $\alpha^{056} = 5d$ | $\alpha^{229} = 7a$ |
| $\alpha^{064} = 5f$ | | | |
| $\alpha^{065} = be$ | $\alpha^{046} = 9f$ | | |
| $\alpha^{066} = 61$ | | | |
| $\alpha^{067} = c2$ | $\alpha^{160} = e6$ | | |
| $\alpha^{068} = 99$ | $\alpha^{142} = 2a$ | $\alpha^{204} = dd$ | $\alpha^{232} = f7$ |
| $\alpha^{069} = 2f$ | $\alpha^{060} = b9$ | | |
| $\alpha^{070} = 5e$ | $\alpha^{146} = 9a$ | | |
| $\alpha^{071} = bc$ | | | |
| $\alpha^{072} = 65$ | | | |
| $\alpha^{073} = ca$ | $\alpha^{168} = fc$ | | |
| $\alpha^{074} = 89$ | $\alpha^{069} = 2f$ | | |
| $\alpha^{075} = 0f$ | | | |
| $\alpha^{076} = 1e$ | | | |
| $\alpha^{077} = 3c$ | $\alpha^{174} = f1$ | | |
| $\alpha^{078} = 78$ | | | |
| $\alpha^{079} = f0$ | $\alpha^{052} = 14$ | | |
| $\alpha^{080} = fd$ | $\alpha^{139} = 42$ | | |
| $\alpha^{081} = e7$ | $\alpha^{015} = 26$ | | |
| $\alpha^{082} = d3$ | $\alpha^{042} = b5$ | | |
| $\alpha^{083} = bb$ | $\alpha^{171} = b3$ | | |
| $\alpha^{084} = 6b$ | $\alpha^{195} = 64$ | | |
| $\alpha^{085} = d6$ | $\alpha^{170} = d7$ | $\alpha^{187} = dc$ | $\alpha^{238} = 0b$ |
| $\alpha^{086} = b1$ | $\alpha^{167} = 7e$ | | |
| $\alpha^{087} = 7f$ | $\alpha^{219} = 56$ | | |
| $\alpha^{088} = fe$ | $\alpha^{096} = d9$ | | |
| $\alpha^{089} = e1$ | $\alpha^{158} = b7$ | | |
| $\alpha^{090} = df$ | | | |
| $\alpha^{091} = a3$ | $\alpha^{105} = 1a$ | $\alpha^{115} = 7c$ | $\alpha^{126} = 66$ |
| $\alpha^{092} = 5b$ | $\alpha^{053} = 28$ | | |
| $\alpha^{093} = b6$ | $\alpha^{111} = ce$ | | |
| $\alpha^{094} = 71$ | $\alpha^{152} = 49$ | $\alpha^{199} = 0e$ | $\alpha^{253} = 47$ |
| $\alpha^{095} = e2$ | $\alpha^{216} = c3$ | | |
| $\alpha^{096} = d9$ | $\alpha^{175} = ff$ | | |
| $\alpha^{097} = af$ | $\alpha^{129} = 17$ | | |
| $\alpha^{098} = 43$ | | | |
| $\alpha^{099} = 86$ | $\alpha^{035} = 9C$ | | |
| $\alpha^{100} = 11$ | $\alpha^{041} = d4$ | | |
| $\alpha^{101} = 22$ | $\alpha^{122} = ec$ | | |
| $\alpha^{102} = 44$ | $\alpha^{002} = 04$ | $\alpha^{032} = 9d$ | $\alpha^{068} = 99$ |
| $\alpha^{103} = 88$ | | | |
| $\alpha^{104} = 0d$ | $\alpha^{020} = b4$ | | |
| $\alpha^{105} = 1a$ | | | |
| $\alpha^{106} = 34$ | $\alpha^{117} = ed$ | | |
| $\alpha^{107} = 68$ | $\alpha^{045} = c1$ | $\alpha^{110} = 67$ | $\alpha^{207} = a6$ |
| $\alpha^{108} = d0$ | $\alpha^{100} = 11$ | | |
| $\alpha^{109} = bd$ | $\alpha^{165} = 91$ | $\alpha^{205} = a7$ | $\alpha^{249} = 36$ |
| $\alpha^{110} = 67$ | | | |
| $\alpha^{111} = ce$ | $\alpha^{176} = e3$ | | |
| $\alpha^{112} = 81$ | | | |
| $\alpha^{113} = 1f$ | $\alpha^{212} = 79$ | | |
| $\alpha^{114} = 3e$ | | | |
| $\alpha^{115} = 7c$ | | | |
| $\alpha^{116} = f8$ | | | |
| $\alpha^{117} = ed$ | $\alpha^{189} = 57$ | | |
| $\alpha^{118} = c7$ | | | |
| $\alpha^{119} = 93$ | | | |
| $\alpha^{120} = 3b$ | $\alpha^{172} = 7b$ | | |
| $\alpha^{121} = 76$ | $\alpha^{031} = c0$ | $\alpha^{098} = 43$ | $\alpha^{247} = 83$ |
| $\alpha^{122} = ec$ | $\alpha^{161} = d1$ | | |
| $\alpha^{123} = c5$ | $\alpha^{133} = 6d$ | | |
| $\alpha^{124} = 97$ | | | |
| $\alpha^{125} = 33$ | $\alpha^{099} = 86$ | | |
| $\alpha^{126} = 66$ | $\alpha^{066} = 61$ | $\alpha^{112} = 81$ | $\alpha^{203} = e0$ |
| $\alpha^{127} = cc$ | $\alpha^{173} = f6$ | $\alpha^{228} = 3d$ | $\alpha^{236} = cb$ |
| $\alpha^{128} = 85$ | | | |
| $\alpha^{129} = 17$ | $\alpha^{190} = ae$ | | |
| $\alpha^{130} = 2e$ | $\alpha^{092} = 5b$ | | |
| $\alpha^{131} = 5c$ | | | |
| $\alpha^{132} = b8$ | | | |
| $\alpha^{133} = 6d$ | $\alpha^{006} = 40$ | | |
| $\alpha^{134} = da$ | $\alpha^{065} = be$ | | |
| $\alpha^{135} = a9$ | $\alpha^{202} = 70$ | | |
| $\alpha^{136} = 4f$ | $\alpha^{029} = 30$ | $\alpha^{153} = 92$ | $\alpha^{209} = a2$ |
| $\alpha^{137} = 9e$ | | | |
| $\alpha^{138} = 21$ | $\alpha^{120} = 3b$ | | |
| $\alpha^{139} = 42$ | $\alpha^{166} = 3f$ | | |
| $\alpha^{140} = 84$ | $\alpha^{037} = 4a$ | | |
| $\alpha^{141} = 15$ | $\alpha^{140} = 84$ | | |
| $\alpha^{142} = 2a$ | | | |
| $\alpha^{143} = 54$ | | | |
| $\alpha^{144} = a8$ | | | |
| $\alpha^{145} = 4d$ | $\alpha^{164} = c6$ | | |
| $\alpha^{146} = 9a$ | $\alpha^{081} = e7$ | | |
| $\alpha^{147} = 29$ | | | |
| $\alpha^{148} = 52$ | $\alpha^{138} = 21$ | | |
| $\alpha^{149} = a4$ | $\alpha^{233} = f3$ | | |
| $\alpha^{150} = 55$ | | | |
| $\alpha^{151} = aa$ | $\alpha^{038} = 94$ | $\alpha^{127} = cc$ | $\alpha^{241} = 58$ |
| $\alpha^{152} = 49$ | | | |
| $\alpha^{153} = 92$ | $\alpha^{008} = 1d$ | $\alpha^{017} = 98$ | $\alpha^{128} = 85$ |
| $\alpha^{154} = 39$ | $\alpha^{093} = b6$ | | |
| $\alpha^{155} = 72$ | | | |
| $\alpha^{156} = e4$ | | | |
| $\alpha^{157} = d5$ | | | |
| $\alpha^{158} = b7$ | $\alpha^{104} = 0d$ | | |
| $\alpha^{159} = 73$ | $\alpha^{028} = 18$ | $\alpha^{144} = a8$ | $\alpha^{242} = b0$ |
| $\alpha^{160} = e6$ | $\alpha^{023} = c9$ | | |
| $\alpha^{161} = d1$ | $\alpha^{080} = fd$ | | |
| $\alpha^{162} = bf$ | $\alpha^{030} = 60$ | | |
| $\alpha^{163} = 63$ | | | |
| $\alpha^{164} = c6$ | $\alpha^{084} = 6b$ | | |
| $\alpha^{165} = 91$ | | | |
| $\alpha^{166} = 3f$ | $\alpha^{087} = 7f$ | | |
| $\alpha^{167} = 7e$ | $\alpha^{026} = 06$ | | |
| $\alpha^{168} = fc$ | $\alpha^{135} = a9$ | | |
| $\alpha^{169} = e5$ | $\alpha^{213} = f2$ | | |
| $\alpha^{170} = d7$ | $\alpha^{085} = d6$ | $\alpha^{119} = 93$ | $\alpha^{221} = 45$ |
| $\alpha^{171} = b3$ | $\alpha^{237} = 8b$ | | |
| $\alpha^{172} = 7b$ | $\alpha^{079} = f0$ | | |
| $\alpha^{173} = f6$ | $\alpha^{063} = a1$ | $\alpha^{180} = 96$ | $\alpha^{185} = 37$ |
| $\alpha^{174} = f1$ | $\alpha^{184} = c4$ | | |
| $\alpha^{175} = ff$ | $\alpha^{108} = d0$ | | |
| $\alpha^{176} = e3$ | $\alpha^{192} = 82$ | | |
| $\alpha^{177} = db$ | $\alpha^{145} = 4d$ | | |
| $\alpha^{178} = ab$ | $\alpha^{161} = 6f$ | | |
| $\alpha^{179} = 4b$ | | | |
| $\alpha^{180} = 96$ | | | |
| $\alpha^{181} = 31$ | $\alpha^{055} = a0$ | $\alpha^{050} = 55$ | $\alpha^{231} = f5$ |
| $\alpha^{182} = 62$ | $\alpha^{210} = 59$ | $\alpha^{230} = f4$ | $\alpha^{252} = ad$ |
| $\alpha^{183} = c4$ | $\alpha^{088} = fe$ | | |
| $\alpha^{184} = 95$ | $\alpha^{106} = 34$ | | |
| $\alpha^{185} = 37$ | | | |
| $\alpha^{186} = 6e$ | $\alpha^{222} = 8a$ | | |
| $\alpha^{187} = dc$ | | | |
| $\alpha^{188} = a5$ | $\alpha^{049} = 8c$ | $\alpha^{143} = 54$ | $\alpha^{251} = d8$ |
| $\alpha^{189} = 57$ | $\alpha^{094} = 32$ | | |
| $\alpha^{190} = ae$ | $\alpha^{177} = db$ | | |
| $\alpha^{191} = 41$ | $\alpha^{114} = 3e$ | $\alpha^{118} = c7$ | $\alpha^{214} = f9$ |
| $\alpha^{192} = 82$ | $\alpha^{095} = e2$ | | |
| $\alpha^{193} = 19$ | | | |
| $\alpha^{194} = 32$ | $\alpha^{003} = 08$ | | |
| $\alpha^{195} = 64$ | $\alpha^{101} = 22$ | | |
| $\alpha^{196} = c8$ | | | |
| $\alpha^{197} = 8d$ | $\alpha^{083} = bb$ | | |
| $\alpha^{198} = 07$ | $\alpha^{070} = 5e$ | | |
| $\alpha^{199} = 0e$ | | | |
| $\alpha^{200} = 1c$ | $\alpha^{082} = d3$ | | |
| $\alpha^{201} = 38$ | | | |
| $\alpha^{202} = 70$ | $\alpha^{244} = fa$ | | |
| $\alpha^{203} = e0$ | $\alpha^{019} = 5a$ | $\alpha^{191} = 41$ | $\alpha^{248} = 1b$ |
| $\alpha^{204} = dd$ | $\alpha^{004} = 10$ | $\alpha^{064} = 5f$ | $\alpha^{136} = 4f$ |
| $\alpha^{205} = a7$ | | | |
| $\alpha^{206} = 53$ | | | |
| $\alpha^{207} = a6$ | $\alpha^{014} = 13$ | $\alpha^{072} = 65$ | $\alpha^{121} = 76$ |
| $\alpha^{208} = 51$ | $\alpha^{040} = 6a$ | | |
| $\alpha^{209} = a2$ | | | |
| $\alpha^{210} = 59$ | | | |
| $\alpha^{211} = b2$ | $\alpha^{013} = 87$ | | |
| $\alpha^{212} = 79$ | $\alpha^{234} = fb$ | | |

TABLE I-continued

| index | root1 | root2 | root3 |
|---|---|---|---|
| $\alpha^{213}$ = f2 | $\alpha^{246}$ = cf | | |
| $\alpha^{214}$ = f9 | $\alpha^{090}$ = df | $\alpha^{159}$ = 73 | $\alpha^{220}$ = ac |
| $\alpha^{215}$ = ef | $\alpha^{054}$ = 50 | | |
| $\alpha^{216}$ = c3 | $\alpha^{200}$ = 1c | | |
| $\alpha^{217}$ = 9b | | | |
| $\alpha^{218}$ = 2b | $\alpha^{075}$ = 0f | $\alpha^{155}$ = 72 | $\alpha^{243}$ = 7d |
| $\alpha^{219}$ = 56 | $\alpha^{044}$ = ee | | |
| $\alpha^{220}$ = ac | | | |
| $\alpha^{221}$ = 45 | | | |
| $\alpha^{222}$ = 8a | $\alpha^{097}$ = af | | |
| $\alpha^{223}$ = 09 | $\alpha^{057}$ = ba | $\alpha^{059}$ = d2 | $\alpha^{107}$ = 68 |
| $\alpha^{224}$ = 12 | | | |
| $\alpha^{225}$ = 24 | $\alpha^{178}$ = ba | | |
| $\alpha^{226}$ = 48 | $\alpha^{169}$ = e5 | | |
| $\alpha^{227}$ = 90 | | | |
| $\alpha^{228}$ = 3d | | | |
| $\alpha^{229}$ = 7a | $\alpha^{124}$ = 97 | $\alpha^{137}$ = 9e | $\alpha^{223}$ = 09 |
| $\alpha^{230}$ = f4 | | | |
| $\alpha^{231}$ = f5 | $\alpha^{007}$ = 80 | $\alpha^{036}$ = 25 | $\alpha^{188}$ = a5 |
| $\alpha^{232}$ = f7 | | | |
| $\alpha^{233}$ = f3 | $\alpha^{134}$ = da | | |
| $\alpha^{234}$ = fb | $\alpha^{123}$ = c5 | | |
| $\alpha^{235}$ = eb | $\alpha^{027}$ = 0c | | |
| $\alpha^{236}$ = cb | | | |
| $\alpha^{237}$ = 8b | $\alpha^{022}$ = ea | | |
| $\alpha^{238}$ = 0b | | | |
| $\alpha^{239}$ = 16 | $\alpha^{156}$ = e4 | $\alpha^{157}$ = d5 | $\alpha^{181}$ = 31 |
| $\alpha^{240}$ = 2c | $\alpha^{089}$ = e1 | | |
| $\alpha^{241}$ = 58 | | | |
| $\alpha^{242}$ = b0 | $\alpha^{062}$ = de | $\alpha^{196}$ = c8 | $\alpha^{239}$ = 16 |
| $\alpha^{243}$ = 7d | $\alpha^{018}$ = 2d | $\alpha^{094}$ = 71 | $\alpha^{131}$ = 5c |
| $\alpha^{244}$ = fa | $\alpha^{067}$ = c2 | | |
| $\alpha^{245}$ = e9 | $\alpha^{141}$ = 15 | | |
| $\alpha^{246}$ = cf | $\alpha^{011}$ = e8 | | |
| $\alpha^{247}$ = 83 | $\alpha^{078}$ = 78 | $\alpha^{206}$ = 53 | $\alpha^{218}$ = 2b |
| $\alpha^{248}$ = 1b | | | |
| $\alpha^{249}$ = 36 | $\alpha^{009}$ = 3a | $\alpha^{047}$ = 23 | $\alpha^{193}$ = 19 |
| $\alpha^{250}$ = 6c | $\alpha^{198}$ = 07 | | |
| $\alpha^{251}$ = d8 | $\alpha^{039}$ = 35 | $\alpha^{103}$ = 88 | $\alpha^{109}$ = bd |
| $\alpha^{252}$ = ad | $\alpha^{132}$ = b8 | $\alpha^{151}$ = aa | $\alpha^{224}$ = 12 |
| $\alpha^{253}$ = 47 | $\alpha^{147}$ = 29 | $\alpha^{179}$ = 4b | $\alpha^{182}$ = 62 |
| $\alpha^{254}$ = 8e | $\alpha^{091}$ = a3 | $\alpha^{201}$ = 38 | $\alpha^{217}$ = 9b |

As mentioned above, the present invention enables multiple erroneous symbols to be corrected and enables the realization of real-time processing of triple error correction with a memory of practical size.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A multiple error correcting method for correcting erroneous symbols included in data encoded by means of an error correcting code and then modulated in accordance with a modulation code, comprising the steps of:

demodulating said data in accordance with said modulation code and producing demodulated data with a demodulation flag indicating whether demodulation is possible;

producing syndromes using a receiving word constituted by a plurality of said demodulated data based on said error correcting code, said error correcting code being a Reed-Solomon code for correcting t-multiple erroneous symbols wherein t is greater than two;

generating a number of erroneous symbols included in said receiving word based on said syndromes, and a number of erasures included in said receiving word based on said demodulation flags;

determining an error form of said receiving word based on said number of erroneous symbols and said number of erasures; and correcting said receiving word based on said error correcting code and said error form.

2. A multiple error correcting method as claimed in claim 1, wherein said step for producing syndromes produces said syndromes ($S_k$) using the equation $$S_k = r(\alpha^{k+1})$$

wherein k is a whole number less than or equal to 4t 1, r(x) corresponds to said receiving word, and $\alpha$ is a primitive polynomial based on said Reed-Solomon code.

3. A multiple error correcting method for correcting erroneous symbols included in data encoded by means of an error correcting code and then modulated in accordance with a modulation code, comprising the steps of:

demodulating said data in accordance with said modulation code and producing demodulated data with a demodulation flag indicating whether demodulation is possible;

producing syndromes using a receiving word constituted by a plurality of said demodulated data based on said error correcting code, said error correcting code being a Reed-Solomon code capable of correcting t-multiple erroneous symbols;

generating a number of erroneous symbols included in said receiving word based on said syndromes, and a number of erasures included in said receiving word based on said demodulation flags;

determining an error form of said receiving word based on said number of erroneous symbols and said number of erasures, said step for determining said error form comprising the steps of:

classifying said receiving word into an uncorrectable error form when a number of erroneous symbols in said receiving word $N_{error}$ is greater than t or when said number of erroneous symbols in said receiving word $N_{error}$ plus a number of erroneous erasures in said receiving word $N_{erasure}$ is greater than 2t, classifying said receiving word into a pure error form when said number of erroneous erasures in said receiving word $N_{erasure}$ is equal to zero and said number of erroneous symbols in said receiving word $N_{error}$ is not equal to zero, said pure error form having at least one erroneous symbol whose location is not known, classifying said receiving word into a pure erasure form when said number of erroneous erasures in said receiving word $N_{erasure}$ is not equal to zero and said number of erroneous symbols in said receiving word $N_{error}$ is equal to zero, said pure erasure form having at least one erasure, and classifying said receiving word into a composite error form when said number of erroneous erasures in said receiving word $N_{erasure}$ is not equal to zero and said number of erroneous symbols in said receiving word $N_{error}$ is not equal to zero, said composite error form having at least one erroneous symbol whose location is not known and at least one erasure, wherein said number of erroneous symbols in said receiving word $N_{error}$ denotes a number of erroneous symbols whose locations are not known; and correcting said receiving word based on said error correcting code and said error form.

4. A multiple error correcting method as claimed in claim 3, wherein said step for correcting said receiving word comprises the steps of:

producing coefficients of an error location polynomial using said syndromes, a degree of an error location polynomial being said number of erroneous symbols $N_{error}$;

producing roots of said error location polynomial using said syndromes and/or locations of said erasures in accordance with said error form in order to produce error-locations;

producing error values related to said error locations using said syndromes and said error locations based on said Reed-Solomon code; and converting said receiving word based on said error locations and error values.

5. A multiple error correcting method as claimed in claim 4, wherein said step of producing said roots of error location polynomial comprises the steps of:

producing an index using said coefficients of said error location polynomial;

reading out virtual roots of said error location polynomial from a specified memory using said index; and transforming said virtual roots into real roots of said error location polynomial in accordance with a predetermined relationship.

6. A multiple error correcting method as claimed in claim 1, wherein said modulation code is an eight-to-fourteen modulation code.

7. A multiple error correcting method as claimed in claim 1, wherein said modulation code is an eight-to-ten modulation code.

8. A multiple error correcting method for correcting erroneous symbols included in data which is sequentially encoded by means of a second error correcting code and a first error correcting code and then modulated in accordance with a modulation code, comprising the steps of:

demodulating said data based on said modulation code and producing a demodulated symbol with a demodulation flag indicating whether demodulation is possible;

producing first syndromes using a first receiving word constituted by a plurality of said demodulated symbols in accordance with said first error correcting code, said first error correcting code being a first Reed-Solomon code for correcting $t_1$-multiple erroneous symbols, wherein $t_1$ is greater than two;

determining a first error form of said first receiving word based on said first syndromes and demodulation flags therein;

performing a first-error-correcting for correcting said first receiving word based on said first error correcting code and said first error form, and then producing a decoded data including a plurality of error corrected symbols and error flags thereof indicating whether the symbol is correct;

producing second syndromes using a second receiving word including a plurality of said error corrected symbols in accordance with said second error correcting code, said second error correcting code being a second Reed-Solomon code for correcting $t_2$-multiple erroneous symbols, wherein $t_2$ is greater than two;

determining a second error form of said second receiving word based on said second syndromes and said error flags therein; and performing a second-error-correcting for correcting said second receiving word based on said second error correcting code and said second error form.

9. A multiple error correcting method as claimed in claim 8, wherein said demodulation code is an eight-to-fourteen modulation code.

10. A multiple error correcting method as claimed in claim 8, wherein said demodulation code is an eight-to-ten modulation code.

11. A multiple error correcting method as claimed in claim 9, wherein said step of producing said first syndromes produces said syndromes ($S_k$) using the equation $$S_k = r(\alpha^{k+1})$$

wherein $k$ is a whole number less than or equal to $4t_1 1$, $r(x)$ corresponds to said first receiving word, and $\alpha$ is a primitive polynomial based on said first Reed-Solomon code.

12. A multiple error correcting method as claimed in claim 9, wherein said step of producing said second syndromes produces said syndromes ($S_k$) using the equation $$S_k = r(\alpha^{k+1})$$

wherein $k$ is a whole number less than or equal to $4t_2 1$, $r(x)$ corresponds to said second receiving word, and $\alpha$ is a primitive polynomial based on said second Reed-Solomon code.

13. A multiple error correcting method for correcting erroneous symbols included in data which is sequentially encoded by means of a second error correcting code and a first error correcting code and then modulated in accordance with a modulation code, comprising the steps of:

demodulating said data based on said modulation code and producing a demodulated symbol with a demodulation flag indicating whether demodulation is possible;

producing first syndromes using a first receiving word constituted by a plurality of said demodulated symbols in accordance with said first error correcting code, said first error correcting code being a first Reed-Solomon code capable of correcting $t_1$-multiple erroneous symbols;

determining a first error form of said first receiving word based on said first syndromes add demodulation flags therein;

first-error-correcting for correcting said first receiving word based on said first error correcting code and said first error form, and then producing a decoded data including a plurality of error corrected symbols and error flags thereof indicating whether the symbol is correct;

producing second syndromes using a second receiving word including a plurality of said error corrected symbols in accordance with said second error correcting code, said second error correcting code being a second Reed-Solomon code capable of correcting $t_2$-multiple erroneous symbols;

determining a second error form of said second receiving word based on said second syndromes and said error flags therein, said step for determining said first error form comprising the steps of:

classifying into an uncorrectable error form when a number of erroneous symbols in said first receiving word $N_{error\_1}$ is greater than $t_1$ or when a number of erroneous symbols in said first receiving word $N_{error\_1}$ plus a number of erroneous erasures in said first receiving word $N_{erasure\_1}$ is greater than $2t_1$, classifying into a pure error form when said number of erroneous erasures in said first receiving word $N_{erasure\_1}$ is equal to zero and said number of erroneous symbols in said first receiving word $N_{error\_1}$ is not equal to zero, said pure error form having at least one erroneous symbol whose location is not known, classifying into a pure erasure form when said number of erroneous erasures in said first receiving word $N_{erasure\_1}$ is not equal to zero and said number of erroneous symbols in said first receiving word $N_{error\_1}$ is equal to zero, said pure erasure form having at least one erasure, and classifying into a composite error form when said number of erroneous erasures in said first receiving word $N_{erasure\_1}$ is not equal to zero and said number of erroneous symbols in said first receiving word $N_{error\_1}$ is not equal to zero, said composite error form having at least one erroneous symbol whose location is not known and at least one erasure, wherein said number of erroneous symbols in said first receiving word $N_{error\_1}$ denotes a number of erroneous symbols whose locations are not known and are included in said first receiving word; and second-error-correcting for correcting said second receiving word based on said second error correcting code and said second error form.

14. A multiple error correcting method as claimed in claim 13, wherein said step for correcting said first receiving word comprises the steps of:

producing coefficients of a first error location polynomial using said first syndromes, a degree of said first error location polynomial being said number of said erroneous symbols included in said first receiving word;

producing first error locations using said first syndromes and/or said locations of said erasures included in said first receiving word in accordance with said first error form;

producing first error values using said first syndromes and said first error locations in accordance with said first Reed-Solomon code; and converting said first receiving word based on said first error locations and first error values.

15. A multiple error correcting method as claimed in claim 14, wherein said step of producing first error locations comprises the steps of:

producing a first index using said coefficients of said first error location polynomial;

reading out virtual roots of said first error location polynomial from a specified memory using said first index; and transforming said virtual roots into first error locations in accordance with a predetermined relationship.

16. A multiple error correcting method for correcting erroneous symbols included in data which is sequentially encoded by means of a second error correcting code and a first error correcting code and then modulated in accordance with a modulation code, comprising the steps of:

demodulating said data based on said modulation code and producing a demodulated symbol with a demodulation flag indicating whether demodulation is possible;

producing first syndromes using a first receiving word constituted by a plurality of said demodulated symbols in accordance with said first error correcting code, said first error correcting code being a first Reed-Solomon code capable of correcting $t_1$-multiple erroneous symbols;

determining a first error form of said first receiving word based on said first syndromes and demodulation flags therein;

first-error-correcting for correcting said first receiving word based on said first error correcting code and said first error form, and then producing a decoded data including a plurality of error corrected symbols and error flags thereof indicating whether the symbol is correct;

producing second syndromes using a second receiving word including a plurality of said error corrected symbols in accordance with said second error correcting code, said second error correcting code being a second Reed-Solomon code capable of correcting $t_2$-multiple erroneous symbols;

determining a second error form of said second receiving word based on said second syndromes and said error flags therein, said step for determining said second error form comprising the steps of:

classifying into an uncorrectable error form when a number of erroneous symbols included in said second receiving word $N_{error\_2}$ is greater than $t_1$ or when said number of erroneous symbols in said second receiving word $N_{error\_2}$ plus a number of erroneous erasures in said second second receiving word $N_{erasure\_2}$ is greater than $2t_2$, classifying into a pure error form when said number of erroneous erasures in said second receiving word $N_{erasure\_2}$ is equal to zero and said number of erroneous symbols in said second receiving word $N_{error\_2}$ is not equal to zero, said pure error form having at least one erroneous symbol whose location is not known, classifying into a pure erasure form when said number of erroneous erasures in said second receiving word $N_{erasure\_2}$ is not equal to zero and said number of erroneous symbols in said second receiving word $N_{errror\_2}$ is equal to zero, said pure erasure form having at least one erasure, and classifying into a composite error form when said number of erroneous erasures in said second receiving word $N_{erasure\_2}$ is not equal to zero and said number of erroneous symbols in said second receiving word $N_{error\_2}$ is not equal to zero, said composite error form having at least one erroneous symbol whose location is not known and at least one erasure, wherein said number of erroneous symbols in said second receiving word $N_{error\_2}$ denotes a number of erroneous symbols whose locations are not known and are included in said second receiving word; and second-error-correcting for correcting said second receiving word based on said second error correcting code and said second error form.

17. A multiple error correcting method as claimed in claim 16, wherein said step for correcting said second receiving word comprises the steps of:

producing coefficients of a second error location polynomial using said second syndromes, a degree of said second error location polynomial being said number of erroneous symbols included in said second receiving word;

producing said second error locations using said second syndromes and/or said locations of said erasures included in said second receiving word in accordance with said second error form;

producing second error values using said second syndromes and said second error location based on said second Reed-Solomon code; and converting said second receiving word based on said second error locations and said second error values.

18. A multiple error correcting method as claimed in claim 17, wherein said step of producing second error locations comprises the steps of:

producing a second index using said coefficients of said second error location polynomial;

reading out virtual roots of said second error location polynomial from a specified memory using said second index; and transforming said virtual roots into second error locations in accordance with a predetermined relationship.

19. A multiple error correcting method for correcting erroneous symbols included in data which is encoded based on an error correcting code, comprising the steps of:

producing syndromes using said data based on said error correcting code, said error correcting code being a Reed-Solomon code for correcting t-multiple erroneous symbols;

producing coefficients of an error location polynomial based on said syndromes;

producing an index based on said coefficients;

reading out a plurality of virtual roots of said error location polynomial from a specified memory related to said index;

transforming said virtual roots into error locations based on a specified relationship;

producing error values based on said syndromes and said error locations; and transforming said data into error-corrected data based on said error locations and said error values.

20. A multiple error correcting method as claimed in claim 19, wherein said step of producing an index is accomplished according to $$\theta = \frac{k_2}{k_1^{3/2}}$$

wherein $k_1$ represents $\sigma_1^2 + \sigma_2$, $k_2$ represents $\sigma_1\sigma_2 + \sigma_3$ and $\sigma_1$, $\sigma_2$ and $\sigma_3$ represent said coefficient of error location polynomial.

21. A multiple error correcting method as claimed in claim 20, wherein said step of transforming said virtual roots into error locations is accomplished according to $$x^{j1} = Z_1(k_1) + \sigma_1$$

$$x^{j2} = Z_2(k_1) + \sigma_1$$

$$x^{j3} = Z_3(k_1) + \sigma_1$$

wherein $Z_1$, $Z_2$ and $Z_3$ represent said virtual roots, and $x^{j1}$, $x^{j2}$ and $x^{j3}$ represent said error locations.

22. A multiple error correcting method for correcting erroneous symbols included in data which is encoded based on a Reed-Solomon code capable of correcting t-multiple erroneous symbols, comprising the steps of:

producing syndromes ($S_0, S_1, \ldots, S_{2t\_1}$) in accordance with the equation $$S_k = r(\alpha^{k+1})$$

wherein k is a whole number less than or equal to 2t 1, r(x) represents a receiving polynomial constituted by said data, and $\alpha$ represents the primitive polynomial of said Reed-Solomon code;

generating the number of erroneous symbols included in the data based on said syndrome;

producing coefficients ($\sigma_1, \sigma_2, \ldots, \sigma_v$) of an error location polynomial ($\sigma_v + \sigma_{v1}x + \sigma_{v2}x^2 + \ldots + x^v$) in accordance with the following equation $$\begin{bmatrix} \sigma_1 \\ \sigma_2 \\ \cdot \\ \cdot \\ \cdot \\ \sigma_v \end{bmatrix} = \begin{bmatrix} S_{v-1} & S_{v-2} & \ldots & S_1 & S_0 \\ S_v & S_{v-1} & \ldots & S_2 & S_1 \\ \cdot & \cdot & & \cdot & \cdot \\ \cdot & \cdot & & \cdot & \cdot \\ \cdot & \cdot & & \cdot & \cdot \\ S_{2v-2} & S_{2v-3} & \ldots & S_v & S_{v-1} \end{bmatrix}^{-1} \begin{bmatrix} S_v \\ S_{v+1} \\ \cdot \\ \cdot \\ \cdot \\ S_{2v-1} \end{bmatrix}$$

provided the number of said erroneous symbols (v) is less than or equal to t;

producing an index in based on said coefficients ($\sigma_1, \sigma_2, \ldots, \sigma_v$);

reading out virtual roots from a specified memory using said index;

transforming said virtual roots into error locations ($x^{j1}, x^{j2}, \ldots, x^{jv}$) based on a specified relationship;

producing error values in accordance with the following equation $$e_j = \frac{\Omega(\alpha^{-j})}{\prod_{\substack{i=1 \\ i \neq j}}^{v} (1 + \alpha^{-i}\alpha^{-j})}$$

wherein j is a natural number less than or equal to v, the value of $\Omega(x)$ satisfies the equation $$\Omega(x) = \sigma_v + (\sigma_v S_0 + \sigma_{v1})x + (\sigma_v S_1 + \sigma_{v1} S_0 + v_2)x^2 + \ldots + (\sigma_v S_{v1} + \sigma_{v1} S_{v2} + \ldots + 1)x^v$$

and $e_1$ through $e_v$ represent error values; and transforming said data into an error corrected data based on said error locations and error values.

23. A multiple error correcting method as claimed in claim 22, wherein said value t is three.

24. A multiple error correcting method as claimed in claim 23, wherein said step of producing an index is for producing the index $$\theta = \frac{k_2}{k_1^{3/2}}$$

provided that $\sigma_1$, $\sigma_2$ and $\sigma_3$ represent said error locations, $k_1$ represents $\sigma_1^2 + \sigma_2$ and $k_2$ represents $\sigma_1\sigma_2 + \sigma_3$.

25. A multiple error correcting method as claimed in claim 24, wherein said step of transforming said virtual roots ($Z_1$, $Z_2$ and $Z_3$) into error locations ($x^{j1}$, $x^{j2}$ and $x^{j3}$) is accomplished according to $$x^{j1} = Z_1(k_1) + \sigma_1$$
$$x^{j2} = Z_2(k_1) + \sigma_1$$
$$x^{j3} = Z_3(k_1) + \sigma_1$$

wherein $k_1$ represents $\sigma_1^2 + \sigma_2$ and $k_2$ represents $\sigma_1\sigma_2 + \sigma_3$.

26. A multiple error correcting method as claimed in claim 25, wherein said virtual roots stored in said specified memory are the root values of $$f(Z) = Z^3 + Z + \theta$$

wherein $\theta$ represents said index.

* * * * *

UNITED STATES PATENT AND TRADEMARK OFFICE
CERTIFICATE OF CORRECTION

PATENT NO. : 5,450,421
DATED : September 12, 1995
INVENTOR(S) : JOO et al.

It is certified that error appears in the above-identified patent and that said Letters Patent is hereby corrected as shown below:

In the abstract, change the formula of
$$\text{``}x^{j1} = Z_1(^k_1) + \sigma_1 \text{ to } -x^{j1} = Z_1(^k_1)^{\frac{1}{2}} + \sigma_1$$
$$x^{j2} = Z_2(^k_1) + \sigma_1 \qquad x^{j2} = Z_2(^k_1)^{\frac{1}{2}} + \sigma_1$$
$$x^{j3} = Z_3(^k_1) + \sigma_1\text{''} \qquad x^{j3} = Z_3(^k_1)^{\frac{1}{2}} + \sigma_1\text{--}$$

In column 3, lines 3-8, change the formula of
$$\text{``}x^{j1} = Z_1(^k_1) + \sigma_1 \text{ to } -x^{j1} = Z_1(^k_1)^{\frac{1}{2}} + \sigma_1$$
$$x^{j2} = Z_2(^k_1) + \sigma_1 \qquad x^{j2} = Z_2(^k_1)^{\frac{1}{2}} + \sigma_1$$
$$x^{j3} = Z_3(^k_1) + \sigma_1\text{''} \qquad x^{j3} = Z_3(^k_1)^{\frac{1}{2}} + \sigma_1\text{--}$$

Col. 22, In Claim 21, lines 4-8 change the formula of
$$\text{``}x^{j1} = Z_1(^k_1) + \sigma_1 \text{ to } -x^{j1} = Z_1(^k_1)^{\frac{1}{2}} + \sigma_1$$
$$x^{j2} = Z_2(^k_1) + \sigma_1 \qquad x^{j2} = Z_2(^k_1)^{\frac{1}{2}} + \sigma_1$$
$$x^{j3} = Z_3(^k_1) + \sigma_1\text{''} \qquad x^{j3} = Z_3(^k_1)^{\frac{1}{2}} + \sigma_1\text{--}$$

Col. 24, In Claim 25, lines 2-6 change the formula of
$$\text{``}x^{j1} = Z_1(^k_1) + \sigma_1 \text{ to } -x^{j1} = Z_1(^k_1)^{\frac{1}{2}} + \sigma_1$$
$$x^{j2} = Z_2(^k_1) + \sigma_1 \qquad x^{j2} = Z_2(^k_1)^{\frac{1}{2}} + \sigma_1$$
$$x^{j3} = Z_3(^k_1) + \sigma_1\text{''} \qquad x^{j3} = Z_3(^k_1)^{\frac{1}{2}} + \sigma_1\text{--}$$

Signed and Sealed this

Twenty-third Day of February, 1999

Attest:

Q. TODD DICKINSON

*Attesting Officer*  *Acting Commissioner of Patents and Trademarks*